US010472733B2

(12) United States Patent
Takanashi et al.

(10) Patent No.: US 10,472,733 B2
(45) Date of Patent: Nov. 12, 2019

(54) SILICON SINGLE CRYSTAL MANUFACTURING METHOD

(71) Applicant: SUMCO CORPORATION, Tokyo (JP)

(72) Inventors: Keiichi Takanashi, Tokyo (JP); Ken Hamada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 57 days.

(21) Appl. No.: 15/380,196

(22) Filed: Dec. 15, 2016

(65) Prior Publication Data

US 2017/0096747 A1  Apr. 6, 2017

Related U.S. Application Data

(62) Division of application No. 13/855,885, filed on Apr. 3, 2013, now Pat. No. 9,567,692.

(30) Foreign Application Priority Data

Apr. 4, 2012  (JP) .................................. 2012-085799

(51) Int. Cl.
C30B 15/26 (2006.01)
C30B 15/20 (2006.01)
C30B 29/06 (2006.01)

(52) U.S. Cl.
CPC ............ *C30B 15/26* (2013.01); *C30B 15/203* (2013.01); *C30B 29/06* (2013.01); *Y10T 117/1004* (2015.01); *Y10T 117/1008* (2015.01)

(58) Field of Classification Search
CPC ........ C30B 15/203; C30B 15/26; C30B 29/06
See application file for complete search history.

(56) References Cited

U.S. PATENT DOCUMENTS 4,915,775 A    4/1990 Katsuoka
2007/0017435 A1*  1/2007 Takanashi ............... C30B 15/26
                                                                  117/14
(Continued)

FOREIGN PATENT DOCUMENTS

JP    03-031673 B2    5/1991
JP    05-059876 B2    9/1993
(Continued)

OTHER PUBLICATIONS

Office Action issued in Japan family member Patent Appl. No. 2012-085799, dated Feb. 2, 2016, along with an English translation thereof.

*Primary Examiner* — Hua Qi
(74) *Attorney, Agent, or Firm* — Greenblum & Bernstein, P.L.C.

(57) ABSTRACT

A silicon single crystal manufacturing method in which the distance between the heat shield and the melt level of the melt can be regulated in a high precision. The real image includes at least the circular opening of the heat shield provided in such a way that the heat shield covers a part of the melt level of the silicon melt. The mirror image is a reflected image of the heat shield on the surface of the silicon melt. Based on the distance between the obtained real image and the mirror image, the melt level position of the silicon melt is computed, and the distance between the heat shield and the melt level position is regulated.

6 Claims, 12 Drawing Sheets

(56) References Cited

U.S. PATENT DOCUMENTS

| | | | | |
|---|---|---|---|---|
| 2009/0309979 | A1* | 12/2009 | Yang | G06K 9/4638 |
| | | | | 348/206 |
| 2010/0175611 | A1* | 7/2010 | Takanashi | C30B 15/203 |
| | | | | 117/15 |
| 2010/0319611 | A1* | 12/2010 | Orschel | C30B 15/26 |
| | | | | 117/15 |
| 2011/0114010 | A1* | 5/2011 | Hayashida | C30B 15/14 |
| | | | | 117/15 |
| 2011/0259260 | A1 | 10/2011 | Takanashi et al. | |
| 2012/0145068 | A1 | 6/2012 | Takanashi et al. | |

FOREIGN PATENT DOCUMENTS

| | | | | |
|---|---|---|---|---|
| JP | 06-092784 | A | 4/1994 | |
| JP | 2002-527341 | A | 8/2002 | |
| JP | 2003-012395 | A | 1/2003 | |
| JP | 2007-290906 | A | 11/2007 | |
| JP | WO 2009028273 | A1 * | 3/2009 | ............ C30B 15/14 |
| JP | 2011-001262 | A | 1/2011 | |
| WO | 00/22200 | A1 | 4/2000 | |

* cited by examiner

SILICON SINGLE CRYSTAL MANUFACTURING METHOD

CROSS REFERENCE TO RELATED APPLICATIONS

This is a divisional application of U.S. patent application Ser. No. 13/855,885, filed Apr. 3, 2013, which claims the benefit of Japanese Patent Application No. 2012-085799, filed on Apr. 4, 2012. The entire disclosure of each of the above-identified applications, including the specification, drawings, and claims, is incorporated herein by reference in its entirety.

BACKGROUND OF THE INVENTION

[Field of the Invention]

Present invention relates to a silicon single crystal manufacturing apparatus and a silicon single crystal manufacturing method. A high quality silicon single crystal having an intended crystal characteristics can be obtained by the apparatus and method. In the apparatus and the method, the melt level position of the silicon melt is adequately regulated when the silicon single crystal is pulled from the silicon melt by Czockralski method.

[Description of Related Art]

Conventionally, varieties of methods for manufacturing the silicon single crystal are known. However, the most representative method for manufacturing the silicon single crystal is the Czockralski method (hereinafter, referred as CZ method). In the growing silicon single crystal in the CZ method, the silicon melt is formed by melting poly-silicon in a crucible. Then, a seed crystal is immersed in the silicon melt. By pulling the seed crystal in the predetermined rotation speed and pulling speed, the silicon single crystal having an cylindrical shape is grown below the seed crystal.

When the silicon single crystal is grown by the CZ method, distribution and types of defects included in the single crystal depend on ratio of the pulling speed V of the silicon single crystal and the temperature gradient G in the silicon single crystal in the growing direction (herein after referred as V/G).

If the V/G value is too high, excessive voids are formed and the micro-voids (the defect referred "COP" generally), which are aggregates of the voids, are formed. If the V/G value is too low, excessive amount of the interstitial silicon atoms are formed, and the translocation clusters, which are aggregates of the interstitial silicon atoms, are formed. Therefore, in order to manufacture a silicon single crystal free of the COP and the translocation cluster, the V/G value has to be controlled to put the V/G value in an appropriate range in the longitudinal and the radial direction of the silicon ingot.

In the radial direction of the single crystal, the V value is constant at any location. Therefore, it is necessary to design the hot-zone in the CZ reactor in such a way that the temperature gradient G is set to be in a predetermined range in the radial direction of the single crystal. Next, in terms of the longitudinal direction, the G value varies depending on the pulling length of the single crystal. Thus, in order to keep the V/G value in a predetermined range, the V value has to be varied in the longitudinal direction of the single crystal.

Today, crystals free of the COP and the translocation cluster are mass-produced by controlling the V/G value even if the silicon single crystals have diameter of 300 mm However, the silicon wafers free of the COP and the translocation clusters pulled by controlling the V/G value are not consist within the entire surfaces, and include regions that respond differently in the thermal treatment. For example, there are three regions between the COP-forming region and the translocation cluster-forming region. The three regions are OSF region, Pv region, and Pi region in the order of the larger V/G values.

The OSF region contains the plate-shaped oxygen precipitates (OSF nucleus) in the as-grown status, which is the status that no thermal treatment is performed after the single crystal growth. When the OSF region is heat-oxidized at a high temperature (generally 1000° C. to 1200° C.), the OSF (Oxidation Induced Stacking Fault) is formed. The Pv region includes the oxygen precipitation nucleus in the as-grown status. When the Pv region is subjected to a two-step thermal treatment with a low temperature and a high temperature (800° C. and 1000° C., for example), the oxide precipitate can be easily formed in this Pv region. The Pi region does not include the oxygen precipitate nucleus in the as-grown status. In the Pi region, formation of the oxygen precipitate is rare after thermal treatment.

There is a demand for a high quality silicon single crystal with separated Pv and Pi regions (hereinafter referred as PvPi crystal). In order to grow the PvPi crystal, accurate controlling of the V/G value is needed.

Generally, the V/G value is controlled by regulating the pulling speed V. In this V/G value control, the G value in the pulling of the silicon single crystal is largely affected by the distance (interval) between the melt level of the silicon melt and the heat shield provided to face the melt level. The furnace body is dismantled to clean in every pulling batch in the silicon single crystal pulling, and the furnace is re-assembled for the next batch. Therefore, the distances between the melt level of the melt and the heat shield are varied in each pulling batch.

Conventionally, the distance between the melt level of the melt and the heat shield is set by an operator based on visual observation in every pulling batch, making the distance varies in every pulling batch. Therefore, in order to manufacture a silicon single crystal with an intended defect region by controlling the V/G value, it is necessary to measure the melt level position of the silicon melt accurately during the silicon single crystal pulling and to regulate the amount of vertical movement of the crucible precisely.

For example, Patent Literature (PTL) 1 (JP1676655B) discloses a method to measure the melt level position of the silicon melt accurately. In the method disclosed in PTL 1, a fire resistance rod, made of quartz for example, is provided to the heat shield covering the melt level of the melt at the end part of the heat shield facing the melt level of the melt. Then, the standard melt level position (hereinafter referred as melt level) is defined as the melt level position that the fire resistance rod touches the melt level of the melt.

Also, a method, in which the contacting of the seed rod to the melt level of the melt is detected first and used the contacting position as the standard melt level position, is disclosed in PTL 2 (JP2132013B).

SUMMARY OF THE INVENTION

However, in a case where the melt level of the melt rises toward the outer edge side due to influence of the rotation of the crucible or the like and the melt level is not flat because of ruffling of the melt, the front end position of the rod contacting the melt level differs from the central melt level position where the seed crystal is contacted in the technique of PTL 1. In the method described in PTL 2, the height of the melt level before the seed crystal contacts to the melt level of the melt, which is what the inventors of the present invention intend to obtain, since the accurate height position can be obtained after the seed crystal contacts with the melt level of the melt. In addition, the length setup of the seed crystal can be varied. Thus, the melt level position at the beginning of pulling can be affected by the length of the seed crystal.

In short, it is difficult to detect the melt level position at the beginning of the pulling accurately because of the variation of the seed crystal length and disturbed melt level of the melt by the rotation of the crucible, inconsistent gas flow, or the like in the conventional methods described above. Therefore, there is a demand to solve the difficulty.

In addition, the above-mentioned G value in the silicon single crystal pulling is largely affected by shifting of the heat transfer status of radiation from the silicon melt to the single crystal caused by the variation of the distance (gap) between the melt level of the silicon melt and the heat shield provided to face the melt level of the melt. In addition, the flow rate of the atmosphere gas flowing through the gap changes due to the gap variation. Because of this, the amount of evaporation of SiO from the melt level of the silicon melt changes and oxygen concentration soluted in the single crystal can be varied. Thus, the gap variation influences on the oxygen concentration of the crystal and the distribution of the defects, which are ones of the most critical factor of quality of the single crystal pulled, and production yield can be deteriorated by the gap variation. In order to prevent the gap variation, it is necessary to regulate the gap in the whole pulling process. To achieve that, there is a demand for obtaining the height of the melt level of the melt at the beginning of the pulling, which is the initial standard value, more accurately and precisely. However, there is a problem that it cannot be detected in a required accuracy in the above-described conventional techniques.

Also, in a case where the gap is varied in the pulling process before the straight body forming process, which corresponds to the process from the seed process (beginning of the pulling), in which the seed crystal is contacted to the shoulder process, in which the shoulder part (diameter enlarging part) formation is completed, it causes probable alteration of the single crystal characteristics not only in the part that the gap is varied but in the part pulled after the gap variation. Therefore, there is a demand for preventing the gap variation for that reason. Particularly, the gap variation in the nearly end of the necking process for neck part formation has large effect.

It is believed that the gap variation that uniquely differs in each pulling apparatus can be a reason for these undesirable variation of the crystal characteristics at the beginning of the pulling or the whole length of the crystal. Therefore, there is a demand for preventing formation of the gap variation.

The present invention is made under circumstance described above, and has purposes indicated below.

1. Measuring the height of the melt level of the melt at the beginning of the pulling and at the process before the straight body pulling process more accurately without increasing the contamination risk by providing a new contamination source in the reactor.
2. Preventing the deterioration of the crystal quality by the alteration of the crystal characteristics by avoiding the gap variation before the straight body formation.
3. Making it possible to measure the initial gap accurately in order to suppress the variation of the V/G value.
4. Making it possible to measure the initial gap accurately in order to keep the variation of the initial oxygen concentration within a range of a certain value.
5. Reducing the manufacturing cost by improving the production yield of the single crystal.
6. Preventing the variation of the single crystal characteristics in different pulling apparatuses by to make the gap variation, which differs in each pulling apparatus, to be consistent.

[Means to Solve the Problems]

The first aspect of the present invention is a silicon single crystal manufacturing apparatus for pulling the silicon single crystal from a silicon melt stored in a crucible including: an imaging device that takes an image of an area including a melt level of the silicon melt from a location above the melt level of the silicon melt in a direction tilted with respect to a silicon single crystal pulling axis in a predetermined angle; a heat shield that is provided in such a way that the heat shield covers a space above the melt level of the silicon melt with a separation from the melt level of the silicon melt, a circular opening, which the silicon single crystal penetrates during pulling the silicon single crystal, being provided to the heat shield; and a calculating part that takes a real image of the heat shield including at least the opening part and a mirror image of the heat shield reflected on a surface of the silicon melt, calculates an interval between the real image and the mirror image, and converts the interval to a melt level position of the silicon melt.

In the first aspect of the present invention, the calculating part may compute a central location of the heat shield with the imaging device by approximating a circle from an apparent oval image of the circular opening of the heat shield.

In addition, the calculating part may define outlines of the real image and the mirror image using differentiated brightness information of the real image and the mirror image of the heat shield taken with the imaging device and computes a GAP value, which is a distance between the melt level of the silicon melt and a lower end part of the heat shield based on the defined outlines of the real and mirror images during the pulling of the silicon single crystal.

In addition, the calculating part may perform projection transformation, in which the outlines of the real and mirror images of the heat shield taken with the imaging device are projected on the lower end part of the image of the heat shield and transformed outlines are obtained.

In addition, calculating part may use outlines of the real and mirror images including an area equals to or larger than a predetermined area among the outlines of the real and mirror images taken with the imaging device for the computation of the central part of the heat shield.

In addition, the imaging device may take image with an angle in which a deviation between the outlines of the real and mirror images of the heat shield and the approximated circle of the circular opening of the heat shield is a lowest value.

In addition, the calculating part may set the melt level of the silicon melt based on a distance between the real image and the mirror image of the heat shield in an initial process of the pulling of the silicon single crystal and may regulate the melt level of the silicon melt based on the distance between the real image and the mirror image of the heat shield after the initial process to a process in which a diameter of the silicon single crystal reaches to a predetermined value with a regulating part.

The second aspect of the present invention is a silicon single crystal manufacturing method for pulling the silicon single crystal from a silicon melt formed in a crucible including the steps of: imaging in which a real image including at least a circular opening of a heat shield provided in such a way that the heat shield covers a space above the melt level of the silicon melt with a separation from the melt level of the silicon melt, and a mirror image of the heat shield reflected on a surface of the silicon melt are taken; calculating in which a distance between the real and mirror images is computed and the melt level position of the silicon single crystal is converted based on the distance; and GAP-value-regulated pulling in which a GAP value, which is a distance between the melt level of the silicon melt and a lower end part of the heat shield during pulling of the silicon single crystal, is regulated.

In the second aspect of the present invention, an inner diameter of the circular opening of the heat shield D (mm), a diameter of the pulled silicon single crystal P (mm), and the GAP value At (mm) may be set to satisfy a formula (0) indicated below.

[Equation 1]

$$(D-P)/\sqrt{\Delta t} \geq 8 \qquad (0)$$

In addition, the method may further include the steps of a GAP-value setting in which an intended GAP value, which is a GAP value intended to be obtained, is set in advance, and a measured GAP value may be regulated for the measured GAP value to be in a range of plus and minus 1% of the intended GAP value in the step of GAP-value regulated pulling.

In addition, the step of GAP-value regulated pulling may include at least one of the steps of: seeding in which a seed crystal is contacted to the silicon melt and the pulling of the silicon single crystal is initiated; necking in which a diameter of the pulled silicon single crystal is narrowed; shouldering in which the pulled silicon single crystal is widened to form a shoulder part; and straight-body forming in which a straight body is formed in the pulled silicon single crystal.

In addition, the GAP value in the step of shouldering may be regulated to be in a range of plus and minus 1% of the intended GAP value.

As described above, the first aspect of the present invention (referred as the silicon single crystal manufacturing apparatus of the present invention) is a silicon single crystal manufacturing apparatus for pulling the silicon single crystal from a silicon melt stored in a crucible including: an imaging device that takes an image of an area including a melt level of the silicon melt from a location above the melt level of the silicon melt in a direction tilted with respect to a silicon single crystal pulling axis in a predetermined angle; a heat shield that is provided in such a way that the heat shield covers a space above the melt level of the silicon melt with a separation from the melt level of the silicon melt, a circular opening, which the silicon single crystal penetrates during pulling the silicon single crystal, being provided to the heat shield; and a calculating part that takes a real image of the heat shield including at least the opening part and a mirror image of the heat shield reflected on a surface of the silicon part, calculates an interval between the real image and the mirror image, and converts the interval to a melt level position of the silicon melt. Because the silicon single crystal manufacturing apparatus of the present invention is configured as described above, the melt level position computed by the calculating part has sufficient accuracy, allowing the gap value between the lower end part of the heat shield and the melt level of the melt to be regulated more precisely. Because of this, adverse effects originated from the gap value variation can be reduced by adopting a regulating method, like keeping the gap value in a constant range when it is needed. Also, the defect distribution can be regulated at a high precision by regulating its thermal history more precisely. Also, the controllability of the oxygen concentration distribution can be improved by regulating the variation of flow rate of the atmosphere gas, which is affected by the gap value variation, in the pulling at the lower end part of the heat shield and regulating the amount of evaporation of SiO at a high precision. As a result, the silicon single crystal having the intended crystal characteristics can be pulled.

As described above, the second aspect of the present invention (referred as the silicon single crystal manufacturing method of the present invention) is a silicon single crystal manufacturing method for pulling the silicon single crystal from a silicon melt formed in a crucible including the steps of: imaging in which a real image including at least a circular opening of a heat shield provided in such a way that the heat shield covers a space above the melt level of the silicon melt with a separation from the melt level of the silicon melt, and a mirror image of the heat shield reflected on a surface of the silicon melt are taken; calculating in which a distance between the real and mirror images is computed and the melt level position of the silicon single crystal is converted based on the distance; and GAP-value-regulated pulling in which a GAP value, which is a distance between the melt level of the silicon melt and a lower end part of the heat shield during pulling of the silicon single crystal, is regulated. Because the silicon single crystal manufacturing method of the present invention is configured as described above, the melt level position can be measured more precisely without proving an additional expensive equipment such as laser-type liquid gauge and without additional modification to the existing apparatus design. Also, the defect distribution can be controlled at a high precision by regulating the gap value between the lower end part of the heat shield and the melt level of the melt more precisely, reducing the adverse effects originated from the gap value variation, and controlling the thermal history more precisely. Also, the controllability of the oxygen concentration distribution can be improved by regulating the variation of flow rate of the atmosphere gas, which is affected by the gap value variation, in the pulling at the lower end part of the heat shield and regulating the amount of evaporation of SiO at a high precision.

Furthermore, in the silicon single crystal manufacturing method of the present invention, an inner diameter of the circular opening of the heat shield D (mm), a diameter of the pulled silicon single crystal P (mm), and the GAP value At (mm) may be set to satisfy a formula (0) indicated below.

[Equation 2]

$$(D-P)/\sqrt{\Delta t} \geq 8 \qquad (0)$$

Because of the configuration described above, the gap measurement can be performed in the range in which the mirror image is not interfered by the single crystal or the high brightness zone (Fusion Ring: FR) around the single crystal. The reason for having the setup describe above is that the location of the mirror image cannot be detected since the mirror image is interfered by the single crystal or the FR when the setup is not satisfied.

Also, by having the configuration in which the method further includes the steps of a GAP-value setting in which an intended GAP value, which is a GAP value intended to be obtained, is set in advance, and a measured GAP value is regulated for the measured GAP value to be in a range of plus and minus 1% of the intended GAP value, preferably plus and minus 0.3%, in the step of GAP-value regulated pulling, the production yield of the crystal can be improved.
[Effects of the Invention]

In the present invention, the gap value is measured based on the distance (interval) between the real image and the mirror image of the heat shield. Thus, the variation of the distance between the real melt level of the melt and the lower end part of the heat shield can be measured by twice the value of the real value. Therefore, small variations can be precisely detected, and the gap value can be set more accurately. Thus, the melt level position of the silicon melt can be controlled in a high precision within the needed range for the intended V/G value for obtaining defect free region in the whole pulling process from the contacting of the seed crystal to the silicon melt to the completion of pulling the full length of silicon single crystal. As a result, a high quality silicon single crystal with the defect free region can be stably manufactured in a high production yield.

Also, the melt level position of the silicon melt is set based on the distance between the real image and the mirror image of the heat shield in the beginning of the pulling, and the gap value is set to a predetermined status in the present invention. Because of these, the melt level of the silicon melt can be regulated in a high precision within the needed range for V/G value for obtaining the defect free region. Therefore, a high quality silicon single crystal with the defect free region can be stably manufactured in a high production yield. At the same time, by controlling the distribution of the oxygen concentration in a high precision, a high quality silicon single crystal with the defect free region can be stably manufactured in a high production yield.

The gap value between the lower end part of the heat shield and the melt level of the melt can be controlled more precisely, since the computed melt level position has a sufficient accuracy in the present invention. Therefore, the adverse effects originated from the gap value variation can be reduced by reducing the undesirable gap variation, and the defect distribution can be controlled more precisely by regulating the thermal history of the crystal more accurately. Also, the silicon single crystal with an intended crystal characteristics can be pulled by regulating the variation of flow rate of the atmosphere gas, which is affected by the gap value variation, in the pulling at the lower end part of the heat shield, regulating the amount of evaporation of SiO at a high precision, and improving the controllability of the oxygen concentration distribution.

DETAILED DESCRIPTION OF THE INVENTION

Best Mode of the Present Invention

Figure 1:
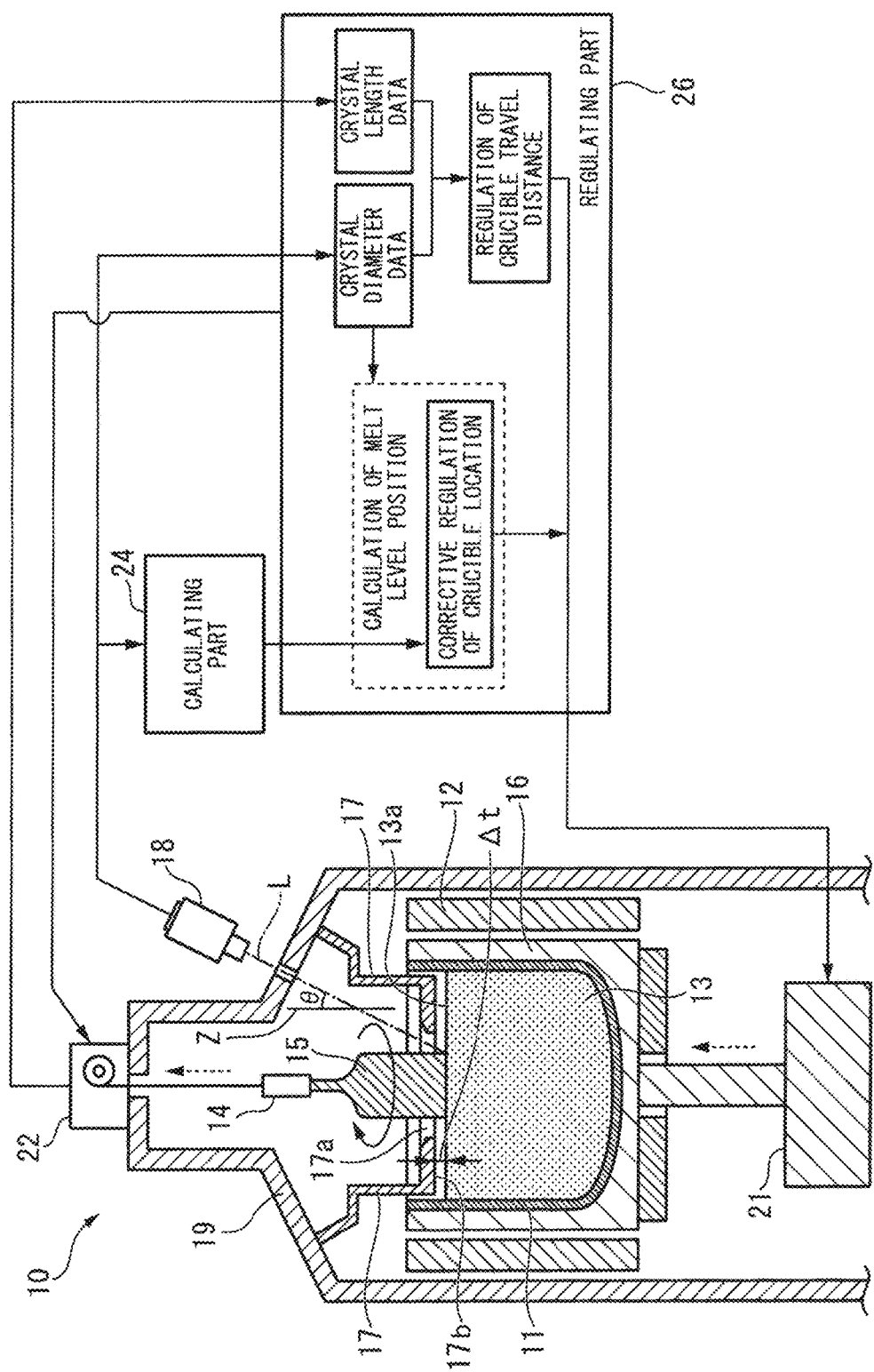
FIG. 1 is a schematic cross-sectional diagram of one example of a silicon single crystal manufacturing apparatus.

Embodiments of the silicon single crystal manufacturing apparatus and the silicon single crystal manufacturing method of the present invention are explained by referring to the drawing below. The embodiments shown below is for better understanding of the present invention by specific explanation, and not for limiting the present invention as long as specifically defined as a limitation of the present invention. Also, a particular part of the drawing is enlarged in the drawings for a convenience. However, the dimensional ratio of each components is not necessary to the one shown in the drawings.

FIG. 1 a schematic cross-sectional diagram of one example of a silicon single crystal manufacturing apparatus. In FIG. 1, the reference symbol 10 indicates the silicon single crystal pulling apparatus (silicon single crystal manufacturing apparatus)

The present embodiment includes the calculating step and the GAP-value regulated pulling step. In the calculating step, the melt level 13*a* of the silicon melt 13 and the real and mirror images including an edge of the opening 17*a* of the heat shield 17 are taken, the distance between the real image and the mirror image is measured, and the location of the real melt level 13*a* of the silicon melt is calculated. At least a part of the opening 17*a* is in a circular shape. In the GAP-value regulated pulling step, the gap value Δt, which is the distance between the melt level of the silicon melt and the lower end part of the heat shield at the beginning of the pulling, is regulated based on the melt level position of the silicon melt obtained in the above-described calculating step.

The silicon single crystal pulling apparatus (silicon single crystal manufacturing apparatus) 10 in the present embodiment includes the chamber 19 in a substantially cylindrical shape and the quartz crucible 11, which is housed in the chamber 19 and stores the molten silicon inside. It is required that the chamber 19 has the double-walled structure having a certain space inside. By running cooling water to the space, over-heating of the chamber 19 during heating of the quartz crucible 11 can be prevented.

An inert gas, such as argon gas is introduced to the inside of the chamber 19 before the beginning of the pulling of the silicon single crystal, during the pulling process, and to the completion of the pulling. On top of the chamber 19, the pulling driving device 22 is provided. The pulling driving device 22 pulls the seed crystal 14, which is the nucleation of the crystal growth, and the silicon single crystal ingot 15 grown below the seed crystal 14 upward, providing rotation to them. It is needed that a sensor (not shown in the drawing) outputting the crystal length information of the silicon single crystal ingot 15 based on the pulled amount of the silicon single crystal ingot 15 is provided to the pulling driving device 22.

The side heater 12 having a substantially cylindrical shape is provided in the chamber 19. The side heater 12 heats the quartz crucible 11. The crucible supporting body (graphite crucible) 16 and the quartz crucible 11 are housed inside of the side heater 12. The quartz crucible 11 is a quartz container having substantially a cylindrical shape that is made of quartz wholly and has an opened surface on top.

In the quarts crucible 11, the silicon melt 13, which is made of molten solid silicon chunks, is stored. The crucible supporting body 16 is made of graphite wholly, for example, and supports the quartz crucible 11 by closely contacting to it. The crucible supporting body keeps the shape of the quartz crucible 11 when it is softened during melting the silicon and supports the quartz crucible 11.

The crucible supporting apparatus (lift) 21 is provided below the crucible supporting body 16. The crucible supporting apparatus 21 supports the crucible supporting body 16 and the quartz crucible 11 underneath. In addition, it allows vertical movement upward and downward in response to the location of the melt level 13a of the silicon melt 13 varying associated with the pulling of the silicon single crystal 15. Because of this, the location of the melt level 13a of the silicon melt 13 is regulated. At the same time, the crucible supporting apparatus 21 supports the crucible supporting body 16 and the quartz crucible 11 rotatably in a predetermined rotation speed.

The heat shield (insulating tube) 17 is formed on the top surface of the quartz crucible 11, in such a way that the heat shield 17 covers the top surface of the silicon melt 13, that is the melt level 13a. For example, the heat shield 17 is made of an insulating board in a bowl shape having the opening 17a at its bottoms part. The silicon single crystal is pulled penetrating through the opening 17a. In the planar view, the opening 17a has a circular shape for example.

The outer edge of the heat shield 17, which is the top end part of the heat shield, may be fixed to the inside of the chamber 19.

By providing the heat shield 17, quality deterioration of the pulled silicon single crystal ingot 15 due to the alteration of the thermal history by receiving the radiation heat from the silicon melt 13 in the quartz crucible 11 can be prevented.

Also, the heat shield 17 directs the atmosphere gas, which is an inert gas such as argon gas, in the silicon single crystal pulling apparatus 10 from the side of the silicon single crystal ingot 15 to the side of silicon melt 13. Thus, the amount of the residual oxygen near the melt level 13a of the silicon melt 13 and the amount of the vaporized silicon or SiO from the silicon melt 13 are regulated. As a result, the silicon single crystal ingot 15 having the intended quality can be obtained. Such regulation of the atmosphere gas in the pulling depends on the internal reactor pressure and the flow rate when the gas passes through the clearance between the bottom part 17b of the heat shield 17 and the melt level 13a of the silicon melt 13. In order to obtain the silicon single crystal ingot 15 with the intended quality, the distance (gap) Δt between the bottom part 17b of the heat shield 17 and the melt level 13a of the silicon melt 13 has to be set accurately. The atmosphere gas can be an inert gas including hydrogen, nitrogen, or other kind of gas as a dopant gas.

The imaging device 18 is provided to the outer side of the chamber 19. The imaging device 18 can be a CCD camera for example. The imaging device 18 take image of the upper surface of the quartz crucible 11 through the window 19a formed to the chamber 19 in the direction of the optical axis L tilted against the pulling axis Z of the silicon single crystal ingot 15 in the predetermined angle θ. The upper surface of the quartz crucible 11 corresponds to the region including the circular opening 17a of the heat shield 17 (insulating tube). Therefore, the imaging device 18 takes image of the upper surface region of the quartz crucible 11 including the heat shield from above in a tilted angle against the pulling direction of the silicon single crystal ingot 15 from the beginning of the pulling to continuous pulling.

The imaging device 18 is connected to the calculating part 24 and the regulating part 26. Also, the calculating part 24 and the pulling driving device 22 are connected to the regulating part 26. The regulating part 26 regulates the amount of vertical movement (rising amount) of the quartz crucible 11 based on the crystal length data of the silicon single crystal ingot 15 obtained from the sensor of the pulling driving device 22 and the crystal length data obtained from the imaging device 18.

The location correction regulation of the quartz crucible 11 is performed based on the location correction data of the quartz crucible 11 computed by the computing part 24 in the regulation of the amount of vertical movement of the quartz crucible 11. The configuration of the calculating part 24 and the calculating process by the calculating part 24 in action are explained below.

As the first function (mirror image calculation), the calculating part 24 computes the melt level position of the silicon melt 13 based on the images including the real image of the heat shield (insulating tube) and the mirror image of the heat shield 17 reflected on the melt level 13a of the silicon melt 13, both of the images being taken by the imaging device 18.

Figure 2:
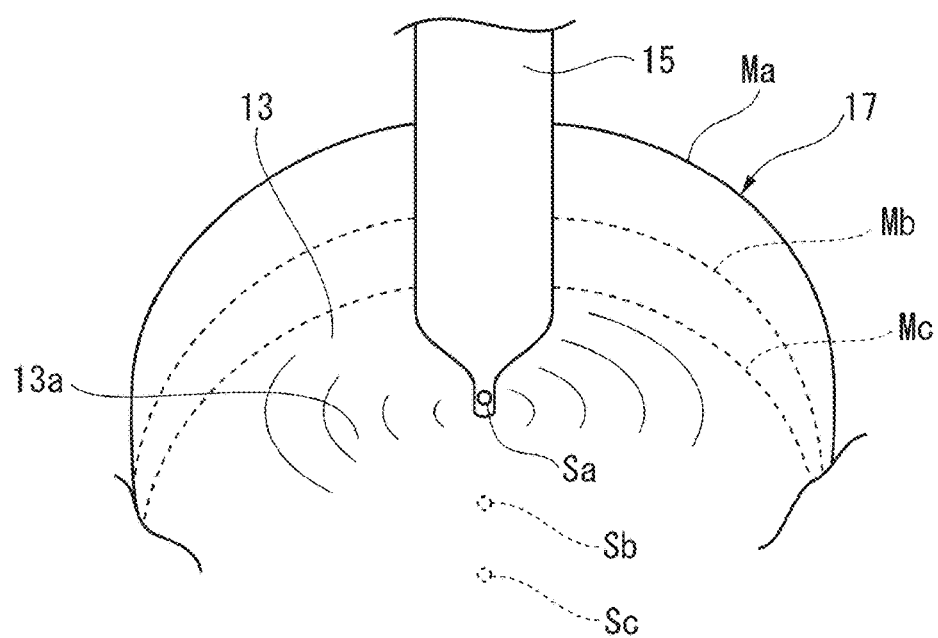
FIG. 2 is an explanatory diagram showing the setup process of the melt level position by the calculating part.

As shown in FIG. 2, the melt level 13a of the silicon melt 13 becomes a mirror surface. Thus, the mirror image of the heat shield 17 (insulating tube) is reflected on the melt level 13a. The mirror image of the heat shield 17 is fixed on the side of the chamber 19, and is kept unmoved even if the silicon melt 13 is moved by the vertical shift of the quartz crucible 11.

Depending on the change of the distance between the heat shield 17 and the melt level 13a, the mirror image of the heat shield 17 formed on the melt level 13a varies by the variation of the height location of the quartz crucible 11. Therefore, the distance between the real image of the heat shield and the mirror image reflected on the melt level 13a varies in response to the vertical movement of the melt level 13a due to the upward and downward of the quartz crucible 11. And, there is a proportional relationship between the distance between the real image and the mirror image, and the vertical movement amount of the melt level 13a.

Also, there is a one-to-one relationship between the distance value (for example, the number of pixels in the image, or the like) between the real and mirror images of the heat shield 17 calculated from the image information of the upper surface region of the quartz crucible 11 taken by the imaging device 18 and the amount of vertical movement of the melt level 13a when the quartz crucible 11 is moved up or down by the crucible supporting device (lift) 21. In reality, they are in a relationship that can be approximated by a quadratic curve or higher in many occasions.

Therefore, the location of the melt level 13a can be determined by following procedure. First the relationship between the distance between the real image and the mirror image and the location of the melt level 13a is established. It can be done by varying the distance between the real image of the heat shield 17 and the mirror image reflected on the melt level 13a by moving the melt level 13a upward and downward and measuring the variation of the distance in multiple points. Second, the point, in which the distance between the real and mirror images of the heat shield 17 becomes zero, is defined as he standard point.

As an example, the location of the melt level 13a can be matched to the initial melt level position by adjusting the distance between the real and mirror images of the heat shield 17 to the initial melt level position based on the above-mentioned relationship by moving the location of the melt level 13a upward and downward, in a condition where the distance between the real and the mirror images of the heat shield 17 at the initial melt level position of the melt level 13a is defined in advance in the image information of the imaging device 18.

In a case where the real and mirror images of the heat shield 17 are taken by a imaging device 18 provide outside of the chamber 19, the errors of the setup state (setup position, angle, or the like) are included in the distance value between the real and the mirror images Therefore, it becomes difficult to set the melt level 13a accurately by computing the distance between the real and mirror images from the image data taken by the imaging device provided outside of the chamber 19.

Contrary to that, by moving the location of the melt level 13a upward and downward to vary the distance between the real and the mirror images of the heat shield 17 and by measuring the variation of the distance in multiple points to identify the melt level 13a indirectly from the variation, the effect of the setup state of the imaging device 18 can be excluded. Thus, the error due to inclination of the imaging device 18 and the error due to the setup position of the imaging device 18 can be excluded.

For example, if the lower end of the heat shield 17 is matched with the melt level 13a, the distance between the real and the mirror images of the heat shield 17 becomes zero. Then, by separating the melt level 13a from lower end of the heat shield 17 by lowering the quartz crucible 11, the distance between the real and the mirror images of the heat shield 17 is widen. In FIG. 2, the center point Sa of the real image of the heat shield 17 is shown. Also, the center points Sb and Sc, which are center points of the mirror images Mb and Mc, respectively, are also indicated in FIG. 2. The mirror images Mb and Mc are mirror images taken at two different points during the lowering of the quartz crucible 11.

Here, the location of the melt level 13a (location of the quartz crucible 11 moved upward and downward by the crucible supporting device (lift) 21) when the center positions Sb and Sc of the mirror images Mb and Mc, respectively, are determined The intervals between the center points Sa, Sb, and Sc are calculated based on the image information taken by the imaging device 18 using the pixel numbers or the like. Therefore, the intervals can be set with an indirect dimension using the pixel numbers of the image information taken by the imaging device 18 or the like, without accurately measuring the real dimension.

The center point of the heat shield 17 is defined as a center point of an approximated circle of the outline (hereinafter referred as edge) of the opening 17a, which is in a circular shape substantially parallel to the melt level 13a in the heat shield 17. Also, in the mirror image of the heat shield 17 reflected on the melt level 13a, the center point is defined by approximating the edge to a circle. Because of this, the distance between the real and the mirror images can be determined by using the center points of the heat shield 17 as a standard.

In order to detect the outline (edge) of the heat shield 17, binarization using a threshold value setup based on the brightness value is performed normally. For example, in the present embodiment, the differential image is used for the edge detection. Because of this, even if the temperature status in the rector is altered and the edge position to be detected is changed, occurrence of the measurement errors can be prevented as explained below.

In the differential image, the amount of variation is indicated as the data. The data of the differential image has maximum value at the edge parts of the real and mirror images of the heat shield 17, and it is nothing to do with the brightness of the original images. Thus, by defining the detected edge as the position having the maximum value in the differential image, the measurement error becomes small even if he the temperature status in the reactor is altered, and the location of the opening 17a of the heat shield 17 can be determined accurately.

Figure 3:
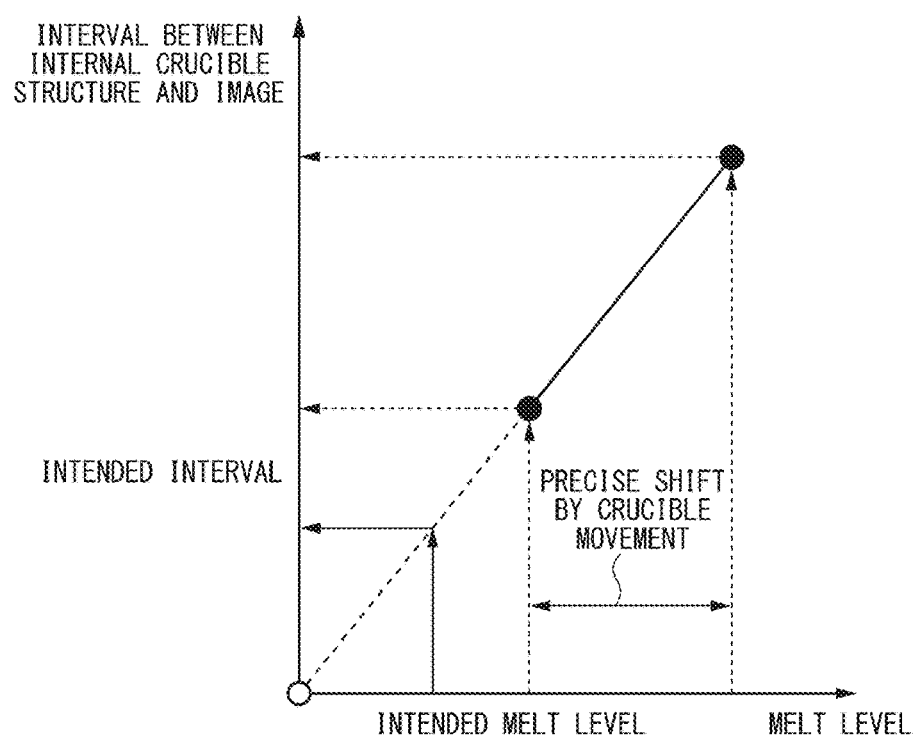
FIG. 3 is a graph showing an example of the relationship between the distance between the real and mirror images and the melt level position.

Here, an example of the corresponding relationship between the distance between the real image Ma of the heat shield 17 and the mirror images Mb and Mc, and the location of the melt level 13a in FIG. 3. FIG. 3 is a graph, the vertical axis of which indicates the distance between the real image Ma of the heat shield 17 and the central points Sb and Sc of the mirror images Mb and Mc, respectively, and the horizontal axis of which indicates the distance when the melt level 13a is moved from the central point Sb of the mirror image Mb to the central point Sc of the mirror image Mc. The distance between the central points Sb and Sc is determined by the regulation amount of the regulating part 26 regulating the crucible supporting device (lift) 21. In this graph, it is shown that there is a proportional relationship represented by an liner function between the distance between the real image Ma of the heat shield 17 and the mirror images Mb and Mc, and the melt level 13a.

Therefore, the distances between the central points Sb, Sc of the two mirror images of Mb, Mc, respectively, are placed unspecified positions of the horizontal axis. Then, the distances between the real image Ma and the central points Sb, Sc of the mirror images of Mb, Mc, respectively, and the distance between the central point Sa and Sc on the vertical axis using the zero point of the graph as its origin. Then, the intersection between the central point Sc on the vertical axis and the central point Sb on the horizontal axis, the slope from the two intersections of two central points Sc on the vertical axis and two central points Sc on the horizontal axis are determined Then, it is moved to the zero point of the graph in the parallel shifting. Because of this, the corresponding relationship between the distances between the real image Ma and the mirror images Mb, Mc and the location of the melt level can be determined In reality, there is no linear proportional relationship between the distance between the real and the mirror images, and the location of the melt level 13a normally, and the relationship is represented by a near quadratic curve. Therefore, the corresponding relationship between the distance between the real and the mirror images and the melt level position is computed by approximation to a quadratic curve using an approximation method such as the least-square method. In this case, the relationship formula is set for each silicon single crystal pulling apparatus in advance, since each single crystal pulling apparatus has unique character in many cases. Also, there is a possibility that the corresponding relationship is represented by a curve with a cubic function or more. In such case, the corresponding formula is appropriately selected to fit the condition.

Once the corresponding relationship (corresponding formula) as shown in FIG. 3 is determined, the melt level (intended melt level position) corresponding to the intended distance determined in advance (the distance between the real and the mirror images when the melt level 13a is in the initial melt level position) is determined based on the corresponding relationship, and the location of the quartz crucible 11 is adjusted to the location. In other words, the difference between the melt level position in the intended interval and the current melt level 13a is calculated, and the crucible supporting device (lift) 21 is moved upward and downward in order to the difference to be zero. In this way, the location of the melt level 13a in the quartz crucible 11 is matched to the initial melt level position which is set in advance.

Specific explanation of the calculation method of the melt level position by the calculating part 24 is shown below.

First, in the calculating part 24, the real and the mirror images of the heat shield 17 are detected in the images obtained by the imaging device 18. Then, central parts of the images are computed in the calculating part 24. Then, based on the distance between the computed central points, the absolute value of the initial gap At (distance between the lower end of the heat shield 17 and the melt level 13a: refer FIG. 1) is measured by the calculating part 24.

The imaging from the imaging device 18 provided in the outside of the chamber 19 is made from above in a tilted angle.

Figure 4A:
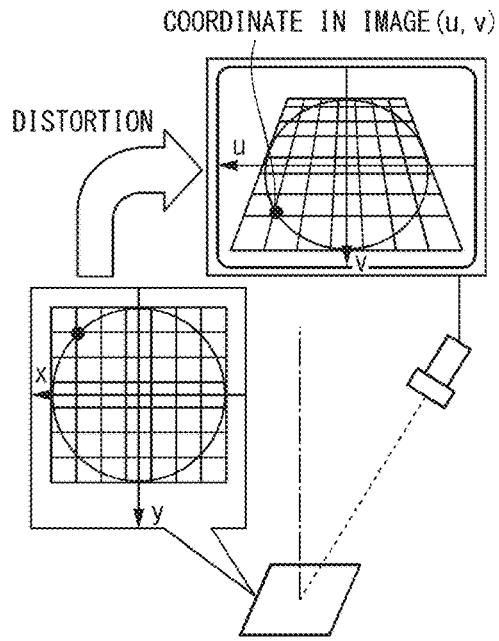
FIG. 4A is an explanatory diagram showing the setup process of the melt level position by the calculating part.

Because of the tilted angle, the opening 17a of the heat shield 17, which is in a circular shape originally, appears in an oval shape in the taken image. More precisely, the lower part of the image is more enlarged compared to the upper part of the image, since the lower part of the image is closer to the imaging device 18, and the image is distorted as shown in FIG. 4A. Thus, in order to determine the central point of the real image and the mirror images of the heat shield 17 accurately, the distorted image has to be corrected. Therefore, the correction is performed by projecting the pixels of the imaging device 18 on the standard plane which corresponds to the lower end of the heat shield 17 by mapping transformation.

The details of the correction method is explained below.

Figure 4B:
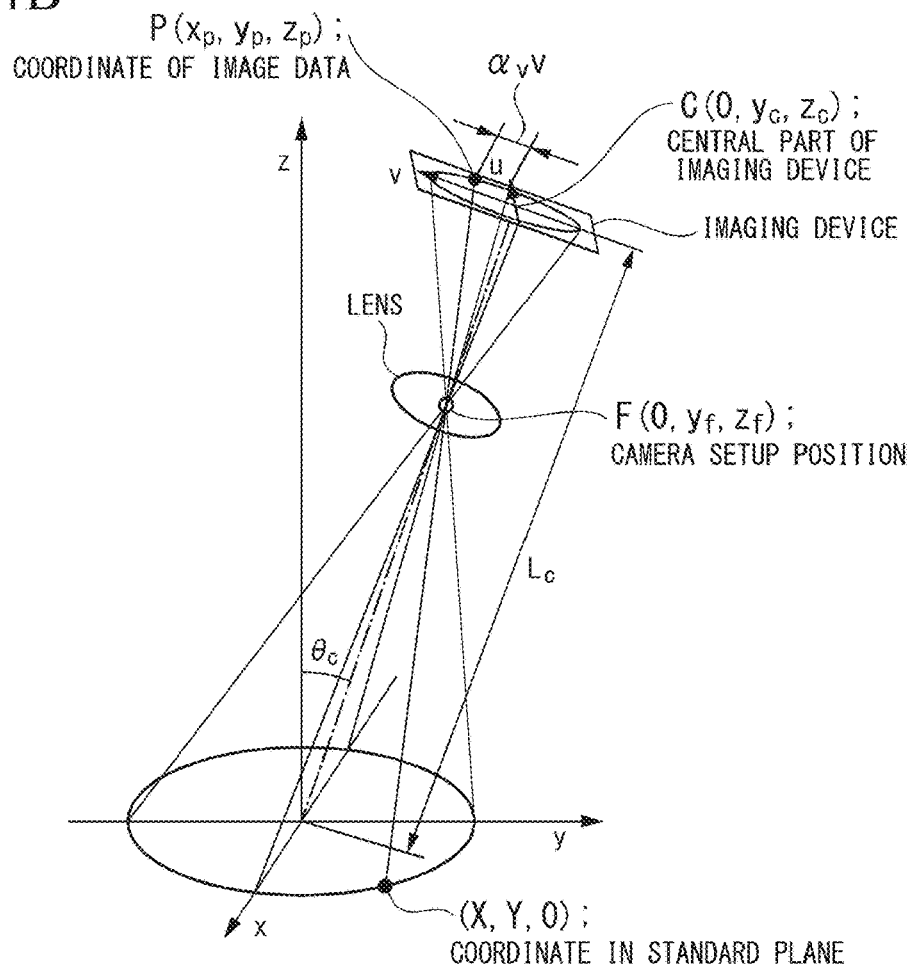
FIG. 4B is an explanatory diagram showing the setup process of the melt level position by the calculating part.

FIG. 4B is a schematic diagram of the coordinate system in the image correction. In the coordinate system, the standard melt level position is shown as the xy plane. The origin of the coordinate is the intersection between the straight line drawn from the central location C of the imaging element consisting the imaging device passing through the center of the camera lens (the dotted line in FIG. 4B) and the standard plane.

As shown in FIG. 4B, the silicon single crystal ingot pulling direction is in the Z axis in the positive direction. Also, the center position C of the imaging element and the center position F of the camera lens are in the yz plane. The coordinate (u, v) shown in FIG. 4A is indicated in the pixel of the imaging device, and corresponds to the point P ($x_p$, $y_p$, $z_p$) on the imaging device represented by the formula (1) below.

[Equation 3]

$$\begin{aligned} x_p &= -a_u u \\ y_p &= y_c - a_v v \cos\theta_c \\ z_p &= z_c + a_v v \sin\theta_c \end{aligned} \qquad (1)$$

Here, $\alpha_u$, and $\alpha_y$ are the horizontal and vertical size of the imaging element of the imaging device. Also, $y_c$ and $z_c$ are the y-coordinate and z-coordinate of the center position C of the imaging device. c$\theta$ is defied as indicated in FIG. 4B. The coordinate of the C (0, $y_c$, $z_c$) is represented by the formula (2) using the central position F of the camera lens

[Equation 4]

$$\begin{aligned} y_c &= \sqrt{y_f^2 + z_f^2}\left[1 + f_l/(\sqrt{y_f^2 + z_f^2} - f_l)\right]\sin\theta_c \\ z_c &= \sqrt{y_f^2 + z_f^2}\left[1 + f_l/(\sqrt{y_f^2 + z_f^2} - f_l)\right]\cos\theta_c \end{aligned} \qquad (2)$$

fl is the focal point distance of the lens used. By regarding the lens as a pinhole, the point P($x_p$, $x_y$, $x_z$) on the imaging element is projected on the standard plane through F(0, $y_f$, $z_f$). By regarding the projected point as (X, Y, 0), (X, Y,) can be expressed by the formula (3) shown below.

[Equation 5]

$$\begin{aligned} X &= -x_p z_f / (z_p - z_f) \\ Y &= (y_f z_p - y_p z_f)/(z_p - z_f) \end{aligned} \qquad (3)$$

By using the formulae (1) to (3), the central points of the real and the mirror images of the opening 17a of the heat shield 17 projected on the standard plane can be obtained. When the central positions are computed from the coordinates of the real and the mirror images projected on the standard plane, the least-square method can be used. An example of computing the central position is described below.

In the present embodiment, the opening 17a of the heat shield 17, which is used for a computation, is in a circular shape. Also, the opening 17a is in parallel with the melt level 13a, which is regarded as a horizontally mirror surfaced standard plane. The image of the opening 17a satisfies the formula (d) represented by the equation of a circle shown below.

[Equation 6]

$$(x-x_0)^2 + (y-y_0)^2 = r^2 \qquad (4)$$

Here, ($x_0$, $y_0$) in the formula (4) and r are computed by the least-square method.

Here, in order to simplify the computation in the least-square method, deformation of the expression shown in the formula (5) below is performed.

[Equation 7]

$$z = a + bx + cy$$

$$\left.\begin{array}{l} z = x^2 + y^2 \\ a = r^2 - x_0^2 - y_0^2 \\ b = 2x_0 \\ c = 2y_0 \end{array}\right\} \quad (5)$$

The variables a, b, and c in the formula (5) are obtained by the least-square method. This can be done by obtaining the condition in which the sum of squares of the difference between the formula (5) and the measured point to be minimum, and can be done by solving the partial differential equation shown in the formula (6) below.

[Equation 8]

$$\frac{\partial}{\partial a, b, c} \sum_i (a + bx_i + cy_i - z_i)^2 = 0 \quad (6)$$

The solution of the formula (6) can be computed by the simultaneous equation shown in the formula (7) below.

[Equation 9]

$$\begin{pmatrix} \sum_i z_i \\ \sum_i z_i x_i \\ \sum_i z_i y_i \end{pmatrix} = \begin{pmatrix} n & \sum_i x_i & \sum_i y_i \\ \sum_i x_i & \sum_i x_i^2 & \sum_i x_i y_i \\ \sum_i y_i & \sum_i x_i y_i & \sum_i x_i^2 \end{pmatrix} \begin{pmatrix} a \\ b \\ c \end{pmatrix} \quad (7)$$

Figure 5:
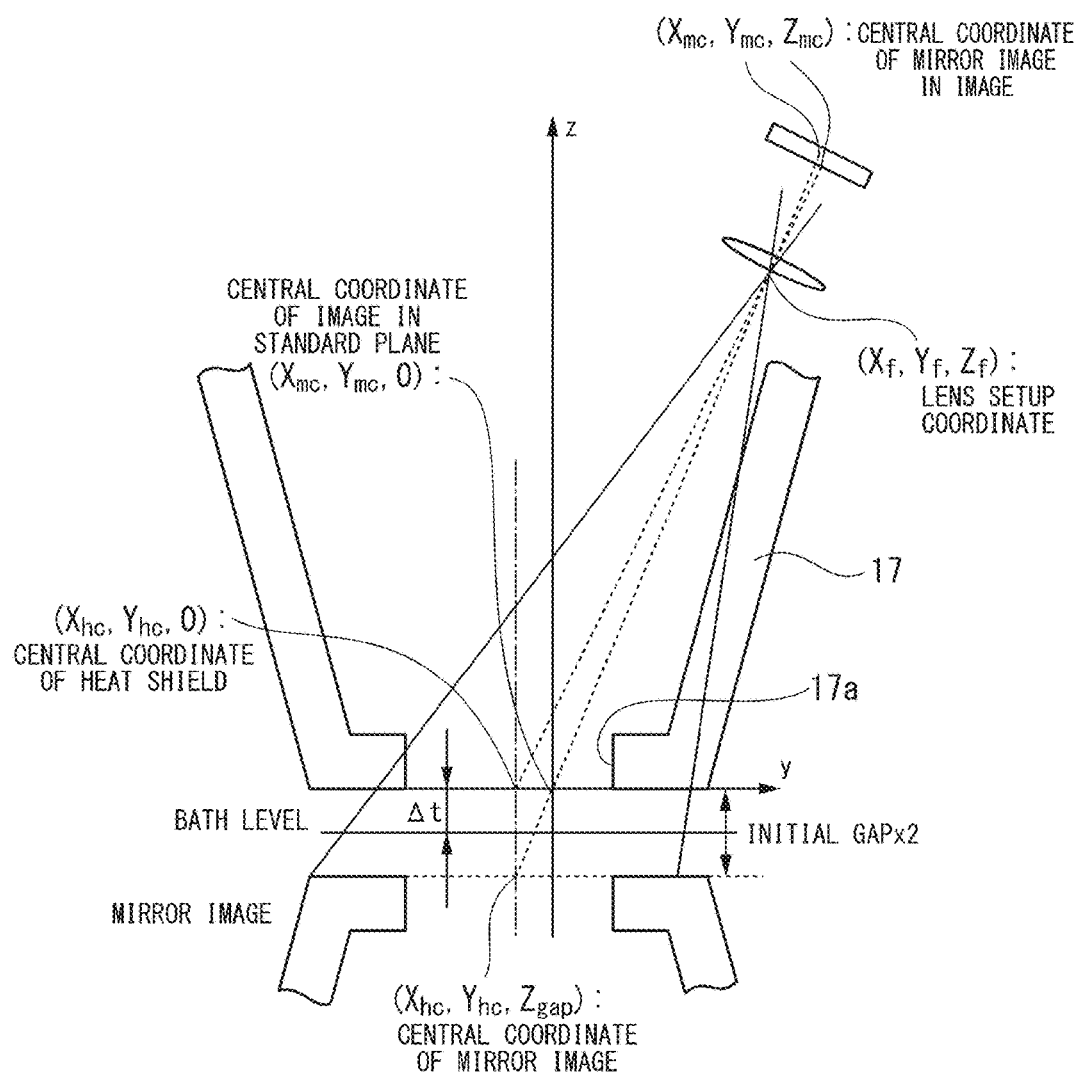
FIG. 5 is an explanatory diagram showing the setup process of the melt level position by the calculating part.

By using the least-square method as explained above, the central position of the real image $(X_{hc}, Y_{hc}, 0)$ and the central position of the mirror image $(X_{mc}, Y_{mc}, 0)$ on the standard plane can be computed from the real image and the mirror image of the heat shield 17 projected on the standard plane shown in FIG. 5, respectively. FIG. 5 shows the concept for computing the absolute value of the gap Δt from these calculated two coordinates. When the heat shield 17 is provided horizontally, the central coordinate of the real image of the heat shield 17 and the central coordinate of the mirror image of the heat shield 17 exist on the opposite side each other centered by the melt level of the melt. The straight line connecting the two points passes through the coordinate $(X_{hc}, Y_{hc}, 0)$ and is parallel with the Z axis.

On the other hand, the central coordinate (Xmc, Ymc, 0) of the mirror image of the heat shield 17 on the standard plane is the coordinate on the standard plane in which the central coordinate $(X_{hc}, Y_{hc}, 0)$ of the real image of the heat shield 17 projected. Thus, the central coordinate $(X_{hc}, Y_{hc}, 0)$ of the real image is positioned on the straight line connecting the central coordinate $(X_{mc}, Y_{mc}, 0)$ on the standard plane and the setup location $(x_f, y_f, z_f)$ of the imaging device. Therefore, the gap Δt, which is intended to be calculated, becomes twice as much of the z gap, and can be calculated by the formula (8) below.

[Equation 10]

$$-2\text{Gap} = Z_{gap} = z_f - z_f(Y_{mc} - y_f)/(Y_{hc} - y_f) \quad (8)$$

When the absolute value of the initial gap is measured as in the present embodiment, it is essential to detect the real and mirror image of the heat shield stably. As the method to detect a specific image in the image data, commonly a threshold value based on the brightness of the image is set to perform the binarization of the original data. However, when the detection of the image of the heat shield in the single crystal pulling apparatus is done by the binarization, there is a possibility that the detection location is varied due to the effect of the brightness change in the temperature shift in the reactor. In order to exclude the effect, a method of detecting the image of the heat shield based on the differences of the brightness is adopted instead of the commonly used binarization method. Because of this, the real and the mirror images of the heat shield can be detected stably without being affected by the brightness change in the temperature shift in the reactor.

Figure 6A:
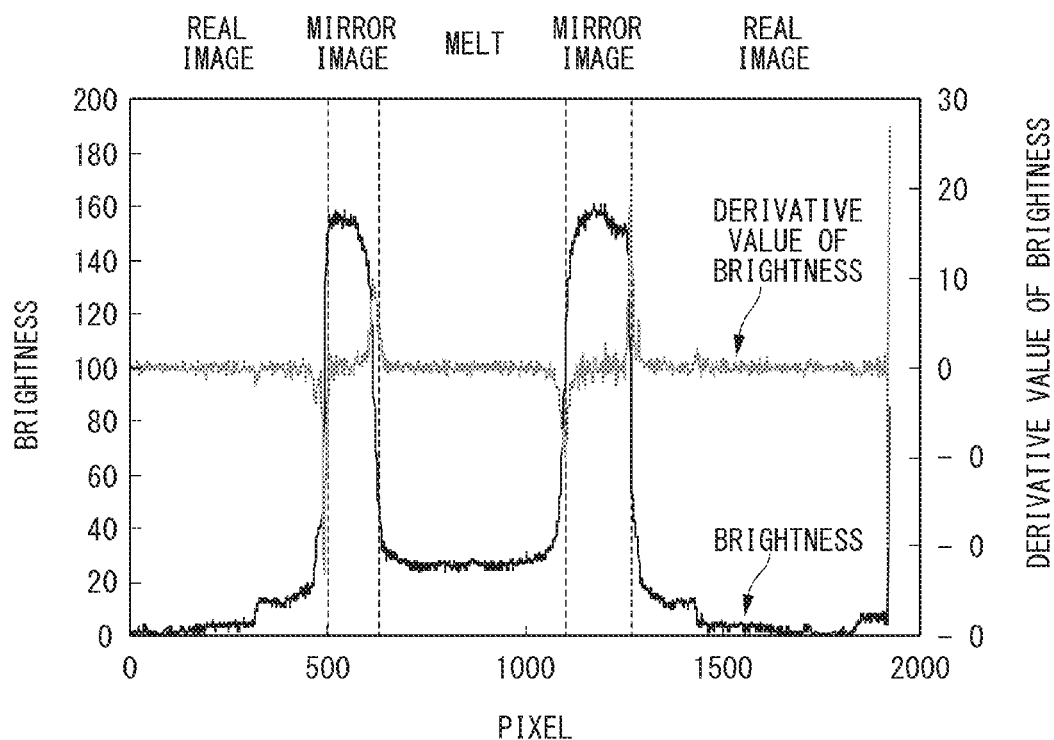
FIG. 6A is an explanatory diagram showing the setup process of the melt level position by the calculating part.

In the detection, the variation of the brightness is obtained by differentiating the brightness distribution in the horizontal direction. FIG. 6A indicates a graph showing the brightness of in horizontal direction of the taken image and its differentiated values corresponding to the brightness. In FIG. 6A, the parts corresponding to the real image of the heat shields are existed in the both sides of the graph. The center part of the graph corresponds to the melt part, and have higher brightness compared to the real image parts. However, the differentiated brightness values are not varied between the two different parts, and clearly the boundaries corresponding to the mirror images of the heat shields can be picked up by using the differentiated brightness values.

As describe above, the differentiation of the brightness can be computed by the difference of brightness in the horizontal direction. In this case, it is largely affected by the noises included in the images.

Figure 6B:
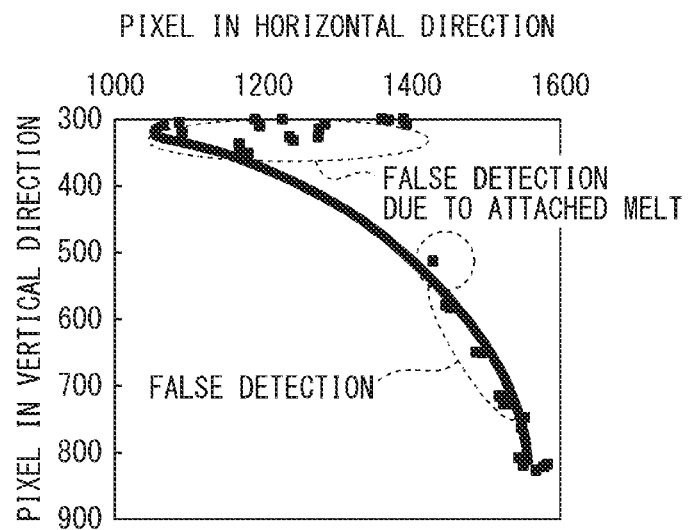
FIG. 6B is an explanatory diagram showing the setup process of the melt level position by the calculating part.

Therefore, the noises are excluded by computing the average values corresponding to 9 pixels in the computed differentiated brightness data in the present embodiment. The locations of the real image and the mirror image of the heat shield are defined by detecting the locations of the peaks in the computed differentiated brightness data The detection result of the images of the heat shield is shown in FIG. 6B. On the lower end surface of the heat shield, the melt is attached due to the splashing of the melt in the melt of the raw silicon materials. The graph shown as FIG. 6B shows that false detections can occur in many occasion. The gap values computed based on such false detections includes a huge error. Thus, it is necessary to establish a method to exclude the false detection due to the melt attachment.

Figure 7:
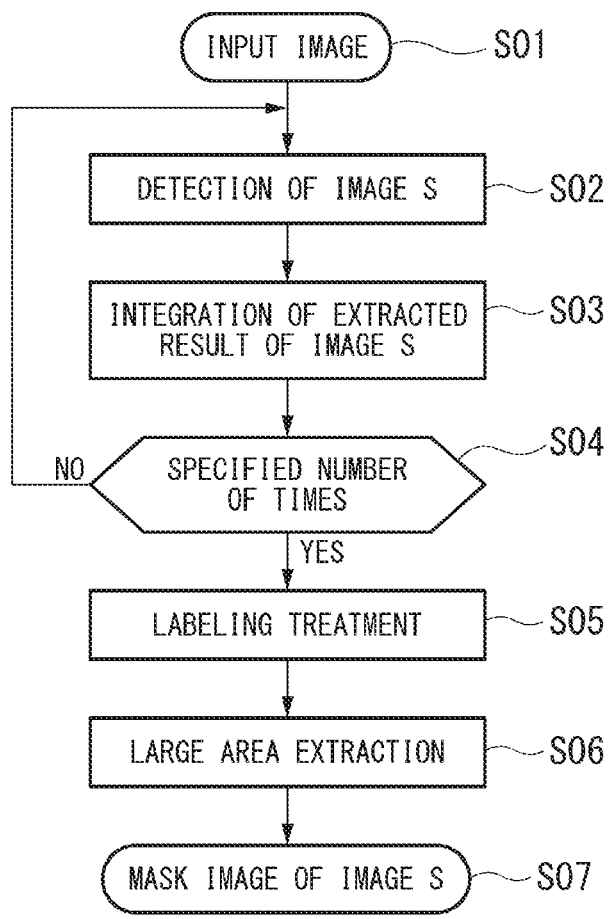
FIG. 7 is a flowchart showing the setup process of the melt level position by the calculating part.

Therefore, an image processing algorithm, which extracts only the edges of the real and the mirror image of the heat shield among the edges of the images of heat shield detected, is used in the present embodiment. The extraction is performed by taking advantage of the fact that the areas of the real and mirror images of the heat shield are larger than the areas causing the false detections. The flowchart of the image processing algorithm is shown in FIG. 7. Here, in FIG. 7, "Image S" indicates the image of the heat shield taken.

As shown in FIG. 7, the taken image is input to the computing part 24 as input image in the step S01 in the image processing algorithm. The edges corresponding to the real and the mirror images of the opening 17a of the insulating part 17 are detected as shown in FIG. 6B in the step S02. The steps S02 and S03 are repeated by number of times specified in the step S04. in the step S03. The image S detected in the step S02 is integrated in the step S03. After finishing the repeating cycle of the step S02 and S03, the labeling treatment is performed in the step S05. The real and mirror images of the opening 17a of the heat shield 17 with larger area are extracted by comparing the areas by counting the numbers of pixels in the step S06.

Figure 8:
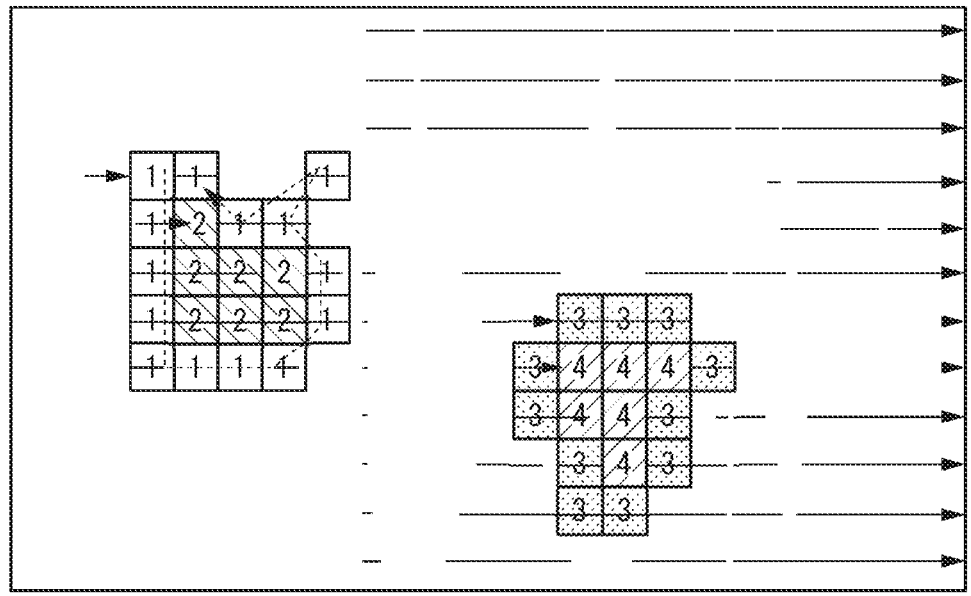
FIG. 8 is an explanatory diagram showing the setup process of the melt level position by the calculating part.

In this image processing, it is needed to identify each edge existing next each other and to perform the labeling treatment in which the same label (number) is allocated to the same connecting component. The concept of a common labeling treatment algorithm is shown in FIG. 8. In this algorithm, the scanning starts from the upper left and the pixel having the value of 255 is searched. When the scanning finds the pixel (the small boxes in FIG. 8), the vicinity of the pixel is checked and the pixel having the value of 255 is searched. When it is found, the searching in the vicinity is repeated. Therefore, the labeling is performed by scanning from the upper left and labeling in the present embodiment.

As explained above, the vicinity of the pixel having the value of 255 is scanned as following the dotted arrow indicated in FIG. 8 in the common labeling treatment algorithm. Depending on images handled, the number of scanning is increased and it take very long processing time. In addition, there is a chance that different labels are allocated to one connected component depending on the shape of the connecting component detected in the commonly used labeling method. In such a situation, the whole re-scan is performed to re-label after the initial labeling treatment.

Figure 9:
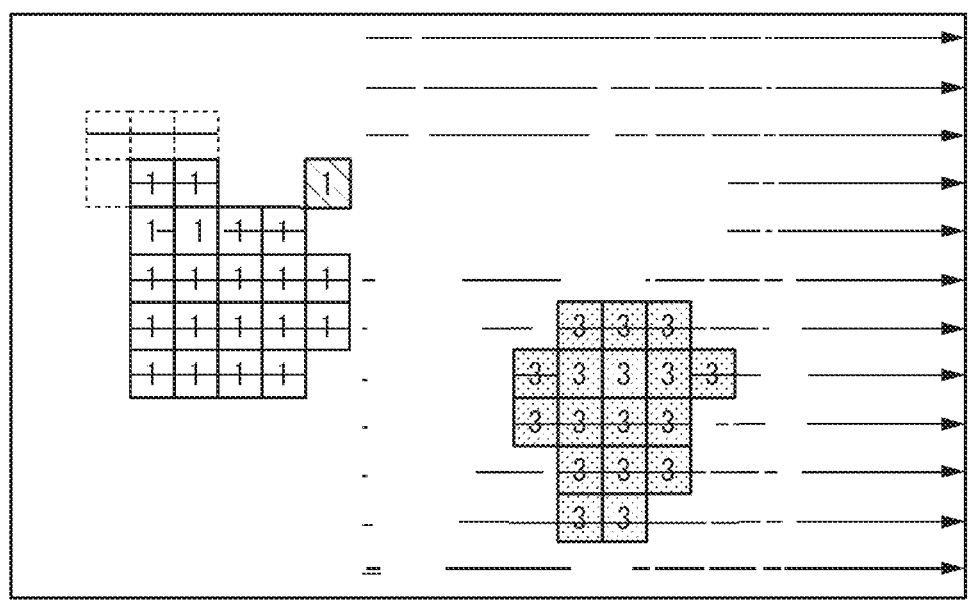
FIG. 9 is an explanatory diagram showing the setup process of the melt level position by the calculating part.

For example, when an image of 2 mega pixels taken by a camera, which is provided to the silicon single crystal pulling apparatus, is processed, it takes about 2 seconds. However, it is preferred the processing completes in about 100 ms (mili second) including the computing the initial gap, realistically. Therefore, it is need to have a fast labeling treatment algorithm The improved labeling treatment algorithm adopted in the present invention is shown in FIG. 9. By using this algorithm shown in the present embodiment, the scanning of the image can be completed by a single scanning In the processing, the scanning start from the upper left of the image as in the commonly used labeling algorithm and pixels having the value of 255 are searched. When such a pixel (small boxes in FIG. 9) is found, the four pixels existing left, upper left, top, and upper right are checked. If they have a labeled number already, the initially found pixel is allocated the same labeling number. Then, the scanning is re-started again. Therefore, the diagonally hatched box in the upper right of the group of boxes labeled as "1" inside, is labeled individually.

In this improve labeling treatment algorithm, the re-labeling process is omitted by devising the process. Therefore, the scanning is only performed once. Thus, the processing speed is significantly shortened compared to the commonly used labeling method.

Also, the area of each connected component is calculated at the same time by counting the number of the pixels labeled in the process. Therefore, the processing time for extracting the images of the heat shield can be shortened in the next step. In the extraction of the images of the heat shield, a part having an area equal to or larger than a predetermined value is selected, in order to distinguish the image of the heat shield from the part attached with the melt, which are difficult to distinguish based on their brightness. Specifically, the part includes the pixel ratio of 150/2,000,000 relative to the total number of pixels in the original image. By the above-mentioned processing, the processing time of the labeling can be shortened to 30 ms.

Figure 10A:
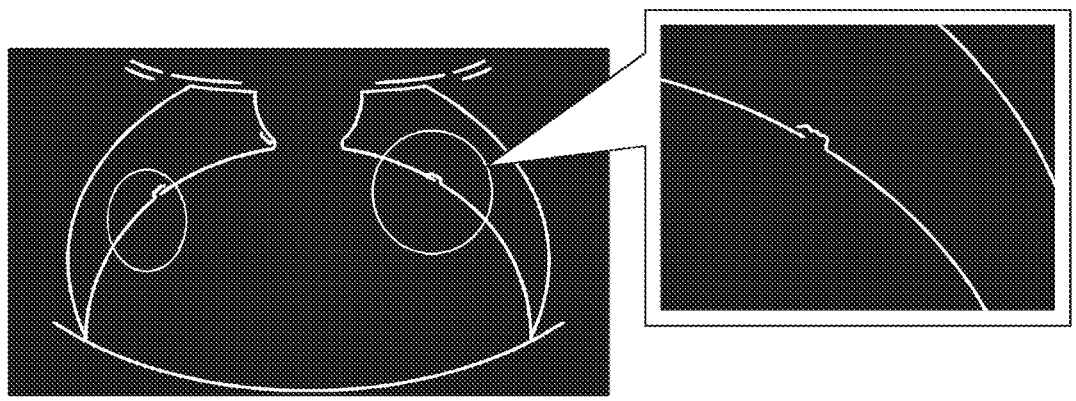
FIG. 10A is an explanatory diagram showing an example of detection of the edge of the heat shield.
Figure 10B:
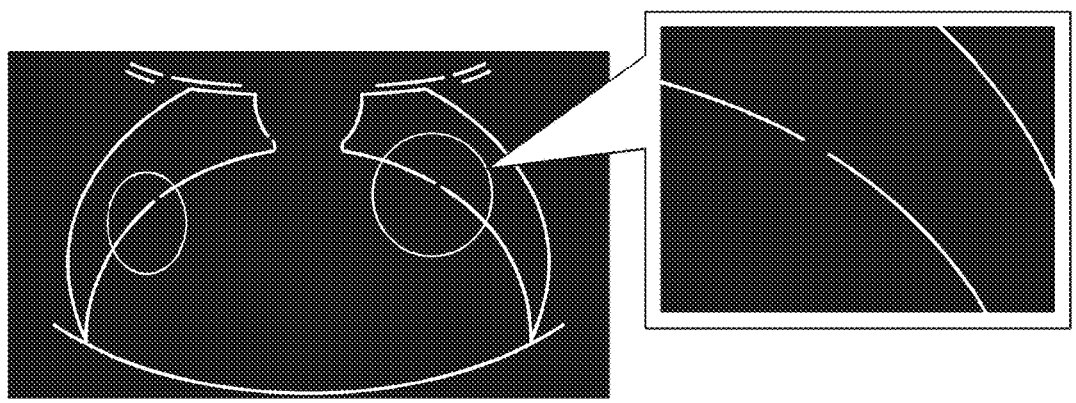
FIG. 10B is an explanatory diagram showing an example of detection of the edge of the heat shield.

The processing result by the above-mentioned labeling algorithm is shown in FIG. 10. FIG. 10A is a result of detecting the real and the mirror images of the heat shield without removing the attached melt. There are false detection due to the attached melt inside the areas enclosed by circles. FIG. 10B is a result of detecting the real and the mirror image with removal of the attached melt. The false detection originally observed in the circled areas are now removed.

The present embodiment includes the calculating step and the GAP-value regulated pulling step. In the calculating step, the melt level 13a of the silicon melt 13 and the real and mirror images including an edge of the opening 17a of the heat shield 17 are taken, the distance between the real image and the mirror image is measured, and the location of the real melt level 13a of the silicon melt is calculated. At least a part of the opening 17a is in a circular shape. In the GAP-value regulated pulling step, the gap value $\Delta t$, which is the distance between the melt level of the silicon melt and the lower end part of the heat shield at the beginning of the pulling, is regulated based on the melt level position of the silicon melt obtained in the above-described calculating step. In the present embodiment, the height of the melt level 13a of the silicon melt is obtained by calculation using the image information taken by the imaging device 18 on the upper surface region of the quartz crucible 11. At the same time, the height of the lower end part of the heat shield 17 is obtained from the controlling information of the crucible support device (lift) 21. Because of these configurations, the height location of the melt level can be measured more precisely without providing the expensive equipment such as the laser-type liquid level gauge and without additional modification to the existing apparatus design, such as providing an observatory window (transparent opening) for imaging to the heat shield 17 and the wall part of the chamber 19. Thus, more accurate measurement of the height location of the melt level can be achieved. Therefore, the gap value $\Delta t$ between the lower end part 17b of the heat shield 17 and the melt level of the melt can precisely regulated to be kept in the range of plus and minus 0.1% of the intended GAP value. When the gap value $\Delta t$ is not kept in the range of plus and minus 1% of the intended GAP value, it is not preferable since the crystal characteristics of the pulled single crystal could be deteriorated. Also, When the gap value $\Delta t$ is not kept in the range of plus and minus 0.33% of the intended GAP value, the crystal characteristics of the pulled single crystal can be regulated even more precisely. Here, the crystal characteristics of the single crystal means dopant concentration, oxygen concentration, void concentration, and interstitial silicon concentration in the crystal, and their distribution in the radius direction and the longitudinal direction of the crystal.

Furthermore, as the operational condition of the calculating step, an inner diameter of the circular opening of the heat shield D (mm), a diameter of the pulled silicon single crystal P (mm), and the GAP value $\Delta t$ (mm) are set to satisfy a formula (0) shown previously. Because of this configuration, the gap measurement can be performed in the range in which the mirror image is not interfered by the single crystal or the high brightness zone (Fusion Ring: FR) around the single crystal. The reason for having the setup describe above is that the location of the mirror image cannot be detected since the mirror image is interfered by the single crystal or the FR when the setup is not satisfied. That is, when the crystal diameter P is constant, and the gap value $\Delta t$ is too large, the mirror image is interfered by getting too close to the single crystal side, making impossible to measure the distance between the real and mirror images Therefore, it is not preferable Similarly, when the gap value $\Delta t$ is constant, and the crystal diameter P is too large relative to the internal dimension D, the mirror image is interfered by getting too close to the single crystal side, making impossible to measure the distance between the real and the mirror images Therefore, it is not preferable.

Further, the calculating part 24 is able to set the gap value by using different functions when the gap value Δt. does not satisfy the above-mentioned operable condition.

As one example of these and as the second function of the calculating part 24 the calculating part 24 is able to set the location of the melt level 13a from the fusion ring (FR) formed in the vicinity of the solid-liquid interface of the silicon melt 13 and the silicon single crystal 15 during the pulling of the silicon single crystal 15. In this case, the fusion ring (FR) is imaged by the imaging device 18, such as a CCD camera. Then, the obtained image data of the fusion ring FR is approximated to a circle or an oval to determine the center location of the silicon single crystal 15.

Figure 11:
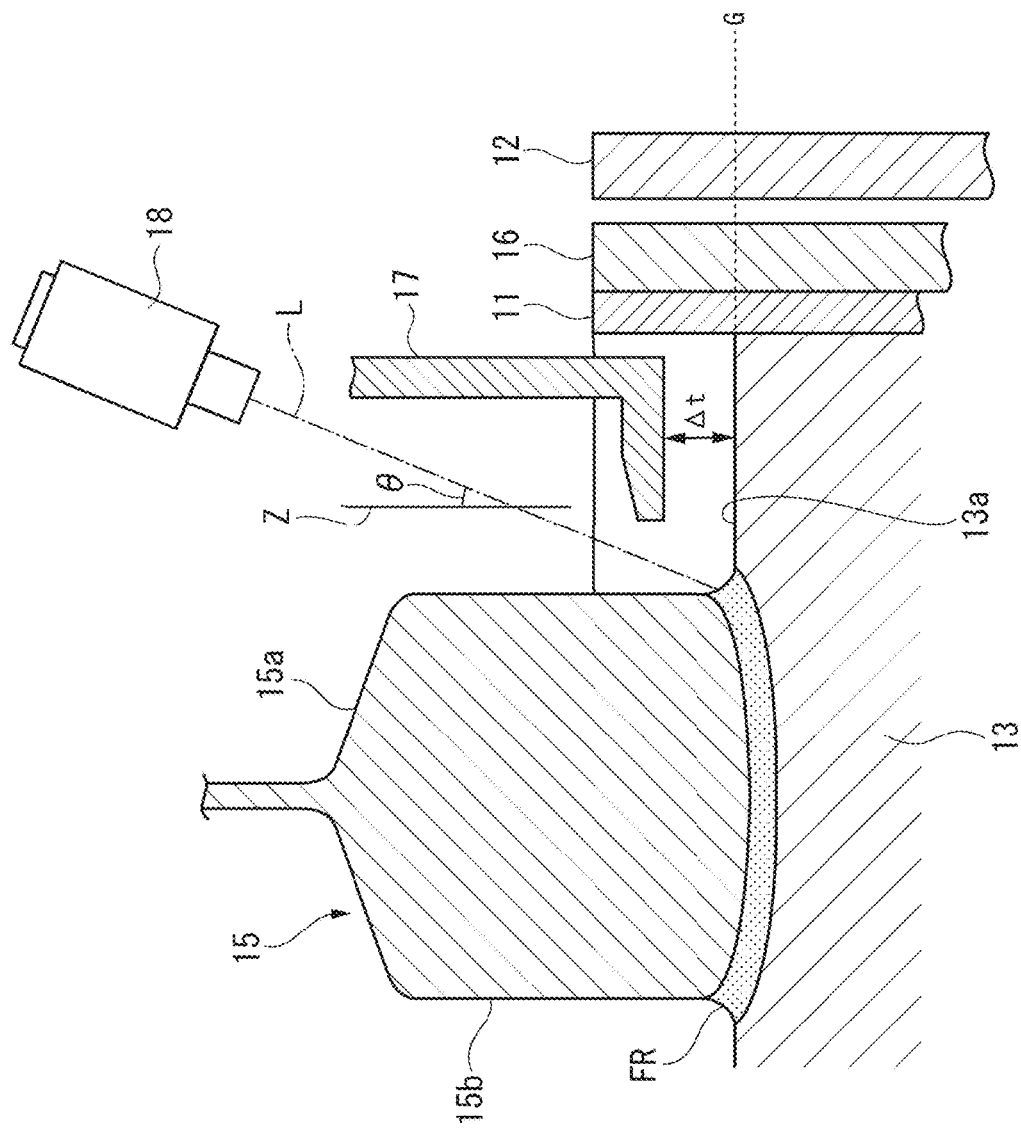
FIG. 11 is an explanatory diagram showing an example of detection of the edge of the heat shield.

FIG. 11 is a schematic diagram showing the setting of the melt level of the melt by the second function of the calculating part 24.

Figure 12:
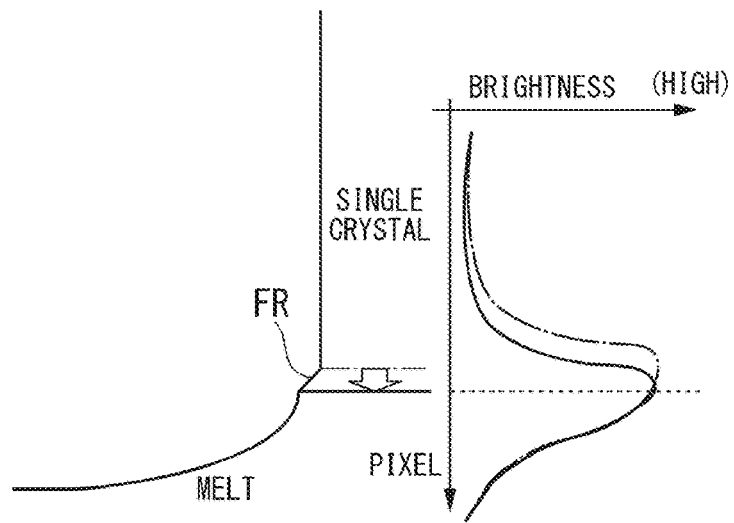
FIG. 12 is an explanatory diagram showing an example of detection of the edge of the heat shield.

The brightness distribution of the fusion ring (FR) taken by the imaging device 18 looks like as shown in the right part of FIG. 12 for example. In other words, the peak of the brightness corresponds to the melt level 13a of the silicon single crystal. The foot section of the brightness of the fusion ring FR corresponds to the part in which the silicon melt 13 is tilted.

Therefore, by calculating the central location of the approximated circle computed by the peak brightness part of the fusion ring FR, the location of the solid-liquid interface of the silicon single crystal 15 can be determined Also, by calculating it by the foot section data of the fusion ring FR, the melt level 13a, which is below the solid-liquid interface, can be determined.

Figure 13:
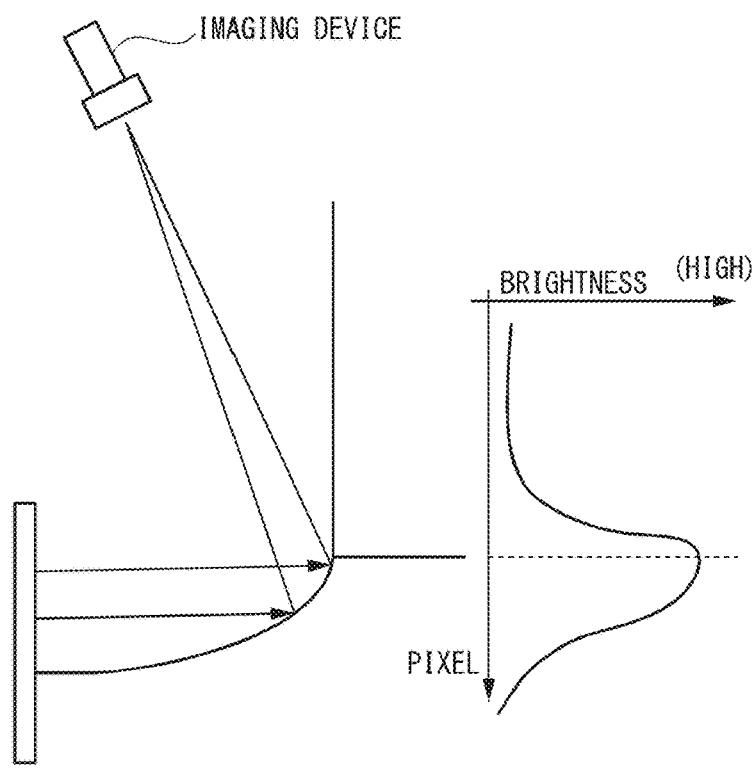
FIG. 13 is an explanatory diagram showing an example of detection of the edge of the heat shield.

When the diameter at the straight body region 15a is varied in the pulling of the silicon single crystal 15, the location of the solid-liquid interface of the silicon single crystal 15 is also varied. For example, if the diameter of the silicon single crystal 15 is narrowed in the pulling, the location of the solid-liquid interface goes down. In this case, the peak location of the brightness is shifted as shown in FIG. 13 in the fusion ring FR.

In the brightness peak position in the fusion ring FR, the location of the solid-liquid interface responds to the variation of the diameter variation of the silicon single crystal 15. Therefore, the central position of the approximated circle or the approximated oval calculated based on the measured data of the brightness of the fusion ring FR, take account in the variation of the height of the solid-liquid interface when the diameter of the silicon single crystal 15 is varied.

In the central position determining step, it is preferable that the image data of the fusion ring FR is subjected to a simple correction based on the angle θ formed between the optical axis direction L of the imaging device 18 and the single crystal pulling direction Z. Then, the center position of the silicon single crystal 15 is computed by a circular approximation of an oval approximation of the image data of the fusion ring FR after the simple correction. It is preferable the simple correction is performed by the formula (9) shown below, for example

[Equation 11]

$$x'=(x-x_0)$$

$$y'=(y-y_0)/((h/v)\cos\theta) \quad (9)$$

In the formula (9), x indicates the detected position in the horizontal direction in the image. $x_0$ indicates half of the horizontal pixels in the used imaging element. x' indicates the horizontal location after the simple correction. y indicates the detected position in the vertical direction in the image. $y_0$ indicates half of the vertical pixels in the used imaging element. y' indicates the vertical location after the simple correction.

It is preferable that the imaging device 18 for imaging the fusion ring FR is a two-dimensional CCD camera. However, a single-dimensional CCD camera allowed to move horizontally can be used instead of the two-dimensional CCD camera. Also, a method, in which multiple fusion ring FR images are taken by a single-dimensional CCD camera from different imaging angles, can be used. Also, the imaging device 18 can be configured by 2 or more of CCD cameras.

Also, it is preferable that the meniscus part of the fusion ring FR includes the solid-liquid interface of the silicon single crystal 15. This height of the solid-liquid interface varies when the diameter of the silicon single crystal 15 is varied. Thus, it is preferable to calculate the melt level of the silicon melt 13 using a region of the fusion ring FR in such a way that the angle of the meniscus is set in a range of 30 to 50°, which is the range that the effect of the height change is less As explained above, the melt level of the silicon melt 13 in the quartz crucible 11 can be calculated based on the central position data of the obtained silicon single crystal 15. In an example of the melt level calculation, a calibration curve, which indicates the relationship between the central position of the silicon single crystal 15 and the melt level of the silicon melt 13, is prepared in advance. Then, by putting the central position of the silicon single crystal 15 obtained in the central position determining step, and by converting it to the melt level of the silicon melt, the melt level position of the silicon melt 13 can be calculated in the measurement time (present).

The controlling part 26 calculates the distance Δt between the location of the melt level of the obtained silicon melt 13 (melt level 13a) and the heat shield 17. Then, the crystal temperature gradient (Gc) in the vicinity of the solid-liquid interface at the center part of the silicon single crystal 15, the crystal temperature gradient (Ge) in the vicinity of the solid-liquid interface at the peripheral part of the silicon single crystal 15, and the flow rate of the pulling atmosphere gas passing beneath the lower end part of the heat shield 17, are controlled based on the distance Δt.

In the controlling step, the controlling part 26 sets the gap Δt between the location of the melt level (melt level 13a) of the silicon melt 13 as a target (an intended) value in advance. Also, the controlling part 26 regulates the operation amount of the crucible supporting device (lift) 21 based on the intended value. For example, the intended value of the gap value Δt, which is needed for a required thermal history and pulling atmosphere gas in response to the grown crystal length (pulling length), is set based on the characteristics of the crystal pulled, in each a each time point such as the necking process, in which the diameter is narrowed in order to reduce the crystal translocation due to a heat shock in the timing in which the seed crystal is immersed at the beginning of the pulling, and the shouldering process, in which the diameter is widened to the point suitable for the wafer production, using the melt level of the silicon melt 13 as the standard in the beginning of the pulling of the silicon single crystal 15.

Furthermore, the relative variation of the melt level of the silicon melt 13 after progression of the pulling is detected by using the melt level of the silicon melt 13 in the start of the pulling of the straight body region (straight body part) 15b of the silicon single crystal 15 as the standard. Then, the quartz crucible 11 is raised by controlling the crucible supporting device (lift) 21 based on the relative variation of the melt level.

Because of this, the melt level 13*a* of the silicon melt 13 is kept in the same position G relative to the heater 12 all the time, even if the amount of the silicon melt 13 is reduced by progression of the pulling of the silicon single crystal 15. Thus, the distribution of the heat radiation to the silicon melt 13 can be kept in a constant status by keeping the gap value Δt in a constant value. In addition, the gap value Δt can be reduced in the last half of the straight body part, which is the last half of the pulling length. Then, the crystal temperature gradient (Gc) in the vicinity of the solid-liquid interface at the center part of the silicon single crystal, the crystal temperature gradient (Ge) in the vicinity of the solid-liquid interface at the peripheral part of the silicon single crystal are controlled in an optimal way individually.

The silicon single crystal pulling step using the silicon single crystal pulling apparatus (silicon single crystal manufacturing apparatus) 10 with the above-mentioned calculating part 24 explained below.

First, poly-silicon, which is the raw material, is inserted in the quartz crucible 11. Then, the quartz crucible 11 is heated by the side heater provide to surround the quartz crucible 11 as shown in FIG. 1. Then, the silicon melt 13 is formed in the quartz crucible 11 by melting the poly-silicon.

At this time, the location of the melt level 13*a* is not known. In this initial pulling step (start), the melt level is set based on distance between the real image Ma of the heat shield and the mirror image Mb reflected on the melt level 13*a* by the calculation part 24.

Images of the melt level 13*a* and the heat shield 17 are taken by the imaging device 18. Imaging is performed by the imaging device 18, in the state where the distance between the central positions (Sa, Sb, and Sc) of the real image Ma, the mirror images Mb, Mc reflected on the melt level 13, respectively, are varied by moving upward and downward the melt level 13*a* in the quartz crucible 11 as shown in FIG. 2.

Then, based on the image information obtained by the imaging device 18, the standard point is determined by measuring the variation of the distance of the central positions at several points (in the graph shown in FIG. 3, two points), determining the corresponding relationship between the distance between the central positions and the location of the melt level, and finding the point in which the distance between the central positions becomes zero in the above-mentioned corresponding relationship.

Then, the location of the melt level 13*a* corresponding to the intended distance of the central positions is set based on the corresponding relationship, and the quartz crucible 11 is moved upward and downward in such a way that the difference between the location and the real melt level 13*a* in the quartz crucible 11 becomes zero. Because of this, the melt level 13*a* can be set as the initial location of the melt level accurately when the seed crystal 14 is contacted to the silicon melt 13.

By setting the melt level 13*a* as the initial location of the melt level accurately and contacting the seed crystal 14 to the silicon melt 13, the pulling is started. The quartz crucible 11 and the seed crystal 14 are rotated in predetermined rotation speeds. After necking, the shoulder part 15*a* with gradually increased diameter is formed. Then, after the diameter reaches to a specific value, and when the gap value becomes a value not included in the operational condition range, the setting of the melt level by the calculating part 24 is switched to the second function (based on the fusion ring).

For example, in the pulling region of the straight body part (straight body region) 15*b* having a consistent diameter set in advance, the setting of the melt level of the silicon melt 13 is performed by the second function of the calculating part 24. In other wards, the central position of the silicon single crystal 15 is determined by imaging the fusion ring FR formed in the vicinity of the solid-liquid interface of the silicon melt 13 and the silicon single crystal 15 by the imaging device, and by circular approximating or oval approximating the image data of the fusion ring FR.

The melt level of the silicon melt 13 in the quartz crucible 11 is calculated based on the data of the central position of the single crystal 15 obtained as described above. Then, the gap (distance) Δt between the location of the melt level (melt level 13*a*) of the obtained silicon melt 13 and the heat shield 17 is computed. Then, the crystal temperature gradient (Gc) in the vicinity of the solid-liquid interface at the center part of the silicon single crystal 15, the crystal temperature gradient (Ge) in the vicinity of the solid-liquid interface at the peripheral part of the silicon single crystal 15, and the flow rate of the pulling atmosphere gas passing beneath the lower end part of the heat shield 17, are controlled based on the distance Δt.

Because of this, the gap value Δt can be set in a high precision in response to the crystal pull length from the staring point, in which the seed crystal contacts to the melt, in the middle of the necking step, the shouldering step, and the straight body step, and to the completion of the pulling of the straight body part.

Because of this, occurrence of unexpected defect distribution in the straight body part due to the gap value variation at the end of the necking step can be prevented.

Detail for this is still unclear. However, it is interpreted that the status of the heat transfer to the heat shield and the single crystal 15 and the status of the atmosphere gas on the silicon melt 13 influenced by the variation of its flow rate is affecting. Still, there is a correlation between the gap value Δt at the end of necking part formation and the occurrence of the single crystal with unacceptable quality, and the latter can be prevented by taking advantages of the correlation. Particularly, the technical effect is remarkable when the crystal with a narrow V/G range, such as the defect-free crystal or the like, is pulled.

Also, the distribution of the heat radiation to the silicon melt 13 can be kept in a constant status because the melt level 13*a* of the silicon melt 13 is kept in the same position G relative to the heater 12 all the time, even if the amount of the silicon melt 13 is reduced by progression of the pulling of the silicon single crystal 15. Thus, the crystal temperature gradient (Gc) in the vicinity of the solid-liquid interface at the center part of the silicon single crystal, the crystal temperature gradient (Ge) in the vicinity of the solid-liquid interface at the peripheral part of the silicon single crystal are controlled in an optimal way individually.

As explained above, the melt level 13*a* of the silicon melt 13 can be regulated in a high precision in the range needed for obtaining the defect-free region of a predetermined V/G value in the entire period of pulling from the contacting the seed crystal to the completion of the pulling of the full length silicon single crystal in this embodiment. In the initial step of the pulling, the melt level of the silicon melt 13 is set by the first function of the calculating part 24 based on the distance between the real and mirror images of the heat shield 17. In the step in which the grown silicon single crystal is proceeded to the straight body part, the function of the calculating part 24 is switched to its second function to set the melt level of the silicon melt 13 based on the image of the fusion ring FR. Because of this, a high quality silicon single crystal with a defect-free region can be manufactured stably in a high production yield. The switching from the first function to the second function of the calculating part 24 is made during the formation of the shoulder part 15a since accuracy of the gap value Δt can be kept in the operation condition range in the first function.

By the first function of the calculating part 24, the absolute value of the height of the silicon melt 13 can be obtained. The setting of the melt level by the second function of the calculating part 24 is used when the diameter of the single crystal widen and the sufficient areas for determining the melt level based on the real image Ma, the mirror images Mb, Mc of the heat shield 17 can not be obtained anymore. During the shoulder formation step, the setting of the melt level can be performed in parallel with the two functions, or the switching can be performed several times to obtain the absolute value of the melt level of the silicon melt 13 with the second calculating part 25. Thus, first the height of the melt level is obtained by the first function of the calculating part 24, and then the absolute value is continuously utilized in the following straight body part, in stead of the relative value obtained in the second function. Because of this, by controlling the crystal characteristics due to the height of the melt level in the straight body part and other crystal growth control conditions at the same time, the crystal having the intended crystal characteristics can be produced in the straight body part where the definitive value as an absolute value cannot be obtained, and a high and precise controllability of the regulation cannot be achieved conventionally.

EXAMPLE

The setting of the melt level by the calculating part of the silicon single crystal manufacturing apparatus of the present invention was validated as follows.

Effectiveness of the measurement method of the initial gap in the beginning of the pulling was confirmed. In this validation, the gap was varied by moving the crucible location after formation of the silicon melt, and the varied amounts and measured values were compared.

Figure 14:
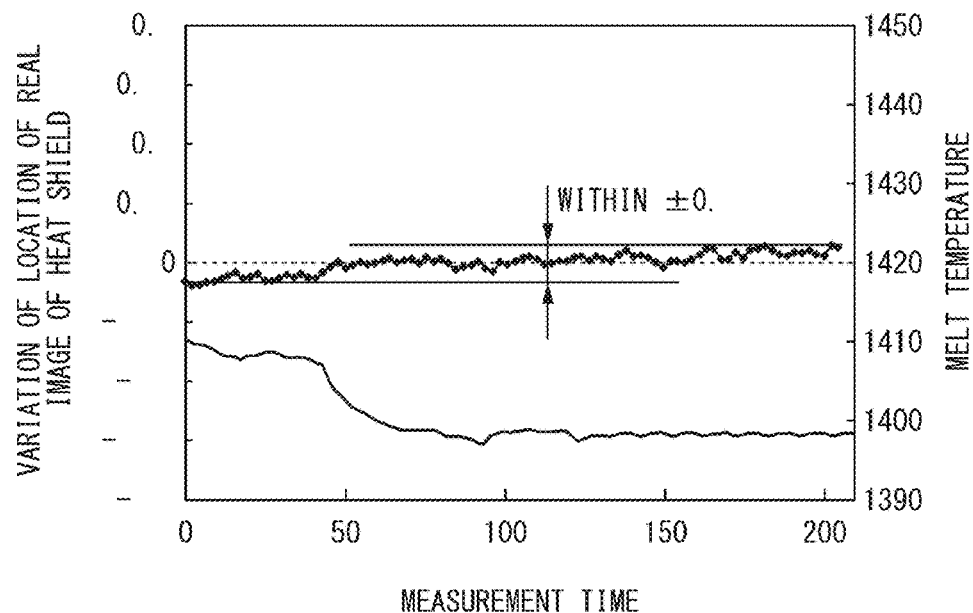
FIG. 14 is a graph showing a validation example of the present invention.

FIG. 14 shows the measured results of the real image locations of the heat shield in the test. It is possible temperature variation in the reactor could vary the brightness distribution in the image, and interferes to the edge detection in the real image. In this testing, the heat shield was fixed on the chamber and the real image location is not changed. Thus, the variation of the measured real image location of the heat shield are errors, and they affect the accuracy of the measured initial gap value.

In the test shown in FIG. 14, the heater temperature was varied more than 10° C. and the temperature in the reactor was significantly changed.

During the temperature change, the shift of the real image was with in the range of plus and minus 0.02 mm, confirming that the temperature change rarely affected to the measurement of the initial cap.

Figure 15:
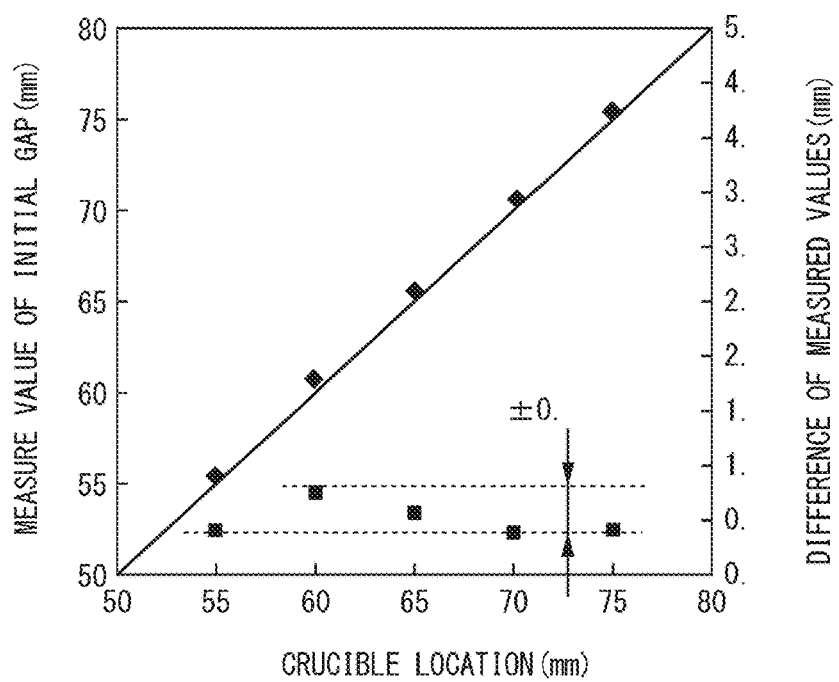
FIG. 15 is a graph showing a validation example of the present invention.

FIG. 15 shows the comparison between the initial gap value calculated in this testing and the gap value varied by moving the crucible. The initial setting the operator set manually was 65 mm. The dots on the diagonal line indicates the results of the comparison, and the dotted horizontal lines indicate the difference of them. The dots on the horizontal lines were between the range of 0.4 mm to 0.8 mm Thus, it was indicated that the measured initial gap value as about 0.5 mm larger.

It was interpreted that this difference represents the deviation of the initial gap setting in this testing. When the results shown in FIG. 15 was evaluated in terms of the gap value variation, it was shown that the variability of the difference between the measured initial gap value and the initial gap value was within the range of pulse and minus 0.2 mm Therefore, it was confirmed that the gap could be measured in the accuracy of plus and minus 0.2 mm from the evaluation results described above.

Figure 16:
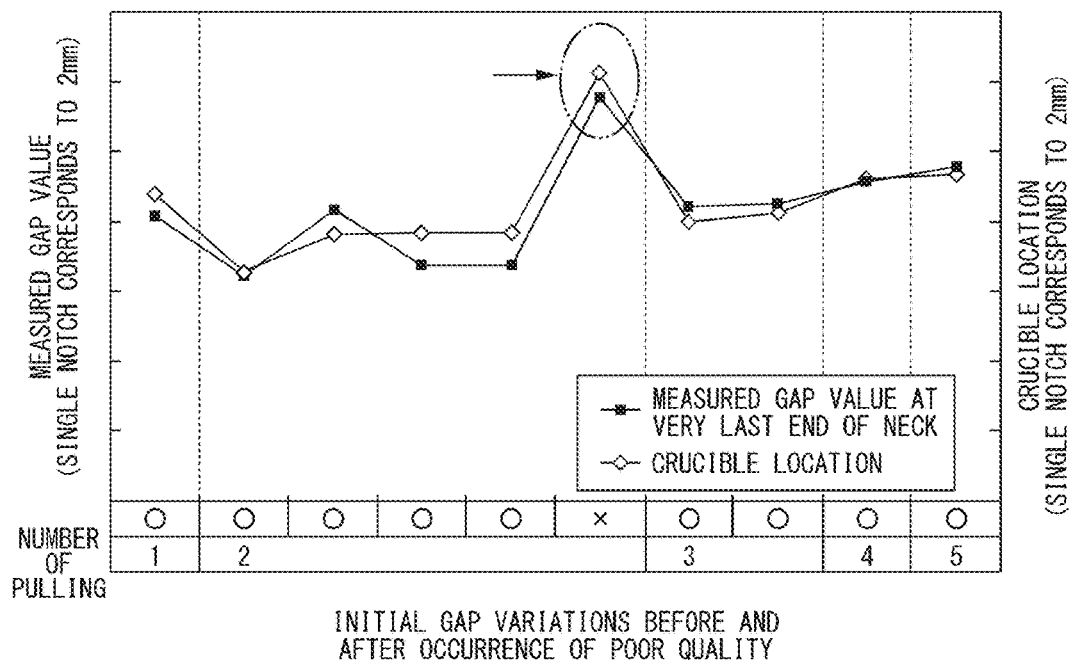
FIG. 16 is a graph showing a validation example of the present invention.

FIG. 16 shows the gap value measurement after the necking step (the vertical axis is in mm). In the testing, pulling was performed five times. The circle and the cross symbols in the bottom part of the graph indicate the quality of the crystal. The circle symbol indicates that the quality had the crystal characteristics as intended. The cross symbol indicates that the quality had an unintended crystal characteristics. In the last of the second pulling (the rightmost part in the second pulling), the measured gap value at the end of the necking step was higher compared to other batches. Accordingly, the quality of the crystal was deteriorated and the corresponding crystal becomes un-shippable.

In the example shown in FIG. 16, when the variation of the gap value was kept in the range of plus and minus 1% of the intended value, the obtained crystals had the intended crystal characteristics without any deterioration of the crystal characteristics, and shippable. Contrary to that, when the gap value was not kept in the range of plus and minus 1% of the intended value, the crystal characteristics was deteriorated as shown in the last part of the second pulling.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

BRIEF DESCRIPTION OF THE REFERENCE SYMBOLS

10: Silicon single crystal pulling apparatus (silicon single crystal manufacturing apparatus)
11: Quartz crucible
12: Heater
13: Silicon melt
13a: Melt level of the melt
15: Silicon single crystal (silicon single crystal ingot)
17: Heat shield
18: Imaging device
19: Chamber
21: Crucible supporting apparatus (lift)
24: Calculating part

What is claimed is:

1. A silicon single crystal manufacturing method for pulling the silicon single crystal from a silicon melt formed in a crucible comprising:
providing an imaging device having an imaging element and that takes an image of an area including a melt level of the silicon melt from a location above the melt level of the silicon melt in a direction tilted with respect to a silicon single crystal pulling axis in a predetermined angle;

providing a heat shield in such a way that the heat shield covers a space above and extends parallel to the melt level of the silicon melt with a separation from the melt level of the silicon melt, a circular opening, which the silicon single crystal penetrates during pulling the silicon single crystal, being provided to the heat shield;

taking a real image of the heat shield including at least the circular opening and a mirror image of the heat shield reflected on a surface of the silicon melt with the imaging device;

calculating an interval between the real and mirror images and converting the interval to a melt level position of the silicon melt; and pulling the silicon single crystal from the silicon melt controlling a gap between the melt level position of the silicon melt and a lower end part of the heat shield, wherein in the calculating, distorted real and mirror images of the circular opening of the heat shield are corrected into undistorted plan view images by mapping transformation using numerical coordinates of a three-dimensional space, an origin of the coordinates being an intersection between a straight line drawn from a center of the imaging element and a standard xy plane, the straight line passing through a center of a lens of the imaging device, in which a point on the imaging element of the imaging device is projected on the standard xy plane corresponding to a lower end plane of the heat shield by using formulas (1) to (3) below:

$$\left.\begin{array}{l}x_p = -a_u u \\ y_p = y_c - a_v v \cos\theta_c \\ z_p = z_c + a_v v \sin\theta_c\end{array}\right\} \quad (1)$$

$$\left.\begin{array}{l}y_c = \sqrt{y_f^2 + z_f^2}\left[1 + f_l/(\sqrt{y_f^2 + z_f^2} - f_l)\right]\sin\theta_c \\ z_c = \sqrt{y_f^2 + z_f^2}\left[1 + f_l/(\sqrt{y_f^2 + z_f^2} - f_l)\right]\cos\theta_c\end{array}\right\} \quad (2)$$

$$\left.\begin{array}{l}X = -x_p z_f/(z_p - z_f) \\ Y = (y_f z_p - y_p z_f)/(z_p - z_f)\end{array}\right\} \quad (3)$$

wherein x, y, and z are the numerical coordinates of the three-dimensional space, a silicon single crystal ingot pulling direction is in a z axis in a positive direction, the center of the imaging element and the center of the lens are in a yz plane, a coordinate (u, v) on the imaging element are obtained by pixels on the imaging device and corresponds to a point $(x_p, y_p, z_p)$ on the imaging device by using the formula (1) above, $\alpha_u$ and $\alpha_v$ are the horizontal and vertical size of the imaging element of the imaging device, $y_c$, and $z_c$, are the y-coordinate and z-coordinate of the center of the imaging device, θc is defined as an angle between the z axis and the straight line, the coordinate $(0, y_c, z_c)$ is obtained by the formula (2) above using coordinates of the center of the lens $(0, y_f, z_f)$, fl being a focal point distance of the lens used, a coordinate (X, Y, Z) on the standard plane is obtained by the formula (3) above in a case where the point $(x_p, x_y, x_z)$ on the imaging element is projected on the standard plane through a coordinate of the center of the lens $(0, y_f, z_f)$ by regarding the lens as a pinhole; and by regarding the projected point as (X, Y, 0), and an inner diameter of the circular opening of the heat shield, D (mm), a diameter of the pulled silicon single crystal, P (mm), and the distance of the gap, Δt (mm), are set to satisfy a formula (0) indicated below $$(D-P)/\sqrt{\Delta t} \geq 8 \quad (0).$$

2. The silicon single crystal manufacturing method according to claim 1, wherein the method further comprises setting the gap in advance, and the gap is regulated in a range of plus and minus 1% of the gap set in advance in the pulling of the silicon single crystal.

3. The silicon single crystal manufacturing method according to claim 1, wherein the pulling the silicon single crystal comprises at least one of:

initiating pulling of the silicon single crystal after contacting a seed crystal to the silicon melt;

necking a pulled silicon single crystal by narrowing a diameter of the pulled silicon single crystal;

shouldering a pulled silicon single crystal by widening the pulled silicon single crystal to form a shoulder part; and forming a straight body of the pulled silicon single crystal.

4. The silicon single crystal manufacturing method according to claim 3, wherein the gap in the shouldering is regulated to be in a range of plus and minus 1% of the gap set in advance.

5. The silicon single crystal manufacturing method according to claim 1, wherein in taking a real image and a mirror image, a labeling treatment algorism is used and the labeling treatment algorism comprises:

searching a pixel having a value of 255 by starting scanning the real and mirror images from an upper left of the images;

in a case where the pixel having a value of 255 is found, checking whether four pixels existing left, upper left, top, and upper right of the pixel having a value of 255 have a labeled number or not; and in a case where the four pixels have a labeled number, allocating the labeled number to the pixel having a value of 255.

6. A silicon single crystal manufacturing method for pulling the silicon single crystal from a silicon melt formed in a crucible comprising:

providing an imaging device having an imaging element and that takes an image of an area including a melt level of the silicon melt from a location above the melt level of the silicon melt in a direction tilted with respect to a silicon single crystal pulling axis in a predetermined angle;

providing a heat shield in such a way that the heat shield covers a space above and extends parallel to the melt level of the silicon melt with a separation from the melt level of the silicon melt, a circular opening, which the silicon single crystal penetrates during pulling the silicon single crystal, being provided to the heat shield;

taking a real image of the heat shield including at least the circular opening and a mirror image of the heat shield reflected on a surface of the silicon melt with the imaging device;

calculating an interval between the real and mirror images and converting the interval to a melt level position of the silicon melt, using numerical coordinates of a three-dimensional space, an origin of the coordinates being an intersection between a straight line drawn from a center of the imaging element and a standard xy plane, the straight line passing through a center of a lens of the imaging device, in which a point on the imaging element is projected on the standard xy plane corresponding to a lower end plane of the heat shield; and pulling the silicon single crystal from the silicon melt controlling a gap between the melt level position of the silicon melt and a lower end part of the heat shield, wherein an inner diameter of the circular opening of the heat shield, D (mm), a diameter of the pulled silicon single crystal, P (mm), and the gap, Δt (mm), are set to satisfy a formula (0) indicated below $$(D-P)/\sqrt{\Delta t} \geq 8 \qquad (0).$$

* * * * *